United States Patent
Goto et al.

(10) Patent No.: US 6,743,702 B2
(45) Date of Patent: Jun. 1, 2004

(54) NITRIDE-BASED SEMICONDUCTOR LASER DEVICE AND METHOD OF FORMING THE SAME

(75) Inventors: Takenori Goto, Ogaki (JP); Yasuhiko Nomura, Moriguchi (JP); Tsutomu Yamaguchi, Nara (JP); Kiyoshi Oota, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/058,378

(22) Filed: Jan. 30, 2002

(65) Prior Publication Data
US 2002/0146855 A1 Oct. 10, 2002

(30) Foreign Application Priority Data

Feb. 2, 2001 (JP) .................................... 2001-026765
Sep. 14, 2001 (JP) .................................... 2001-279020

(51) Int. Cl.$^7$ ...................... H01L 21/265; H01L 21/36; H01L 21/3205
(52) U.S. Cl. ...................... 438/518; 438/505; 438/508; 438/522; 438/604
(58) Field of Search ................................ 438/518, 505, 438/479, 796, 522, 604, 508, 22, 597; 257/99, 94, 745, 748, 102, 103, 97

(56) References Cited

U.S. PATENT DOCUMENTS

| | | | | |
|---|---|---|---|---|
| 5,776,623 A | * | 7/1998 | Hung et al. | 428/690 |
| 5,900,647 A | * | 5/1999 | Inoguchi | 257/76 |
| 5,990,500 A | * | 11/1999 | Okazaki | 257/99 |
| 6,045,626 A | * | 4/2000 | Yano et al. | 148/33.4 |
| 6,117,700 A | * | 9/2000 | Orita et al. | 438/46 |
| 6,121,127 A | * | 9/2000 | Shibata et al. | 438/604 |
| 6,242,761 B1 | * | 6/2001 | Fujimoto et al. | 257/94 |
| 6,399,966 B1 | * | 6/2002 | Tsuda et al. | 257/103 |
| 6,420,198 B1 | * | 7/2002 | Kimura et al. | 438/22 |
| 6,424,669 B1 | * | 7/2002 | Jiang et al. | 372/50 |
| 6,445,011 B1 | * | 9/2002 | Hirano et al. | 257/99 |
| 6,518,602 B1 | * | 2/2003 | Yuasa et al. | 257/102 |
| 6,524,976 B2 | * | 2/2003 | Takeya | 438/796 |
| 6,531,383 B1 | * | 3/2003 | Lee | 438/604 |
| 6,559,038 B2 | * | 5/2003 | Nikoleav et al. | 438/518 |
| 6,559,467 B2 | * | 5/2003 | Nikolaev et al. | 257/12 |

OTHER PUBLICATIONS

"Ohmic contact formation mechanism of nonalloyed Pd contacts to p–type GaN observed by positron annihilation spectroscopy", Lee et al., *Applied Physics Letters*, vol. 74, No. 16., pp. 2289–2291, Apr. 19, 1999.

"Electrical characterization and metallurgical analysis of Pd–containing multilayer contacts on GaN", Chor et al., *Journal of Applied Physics*, vol. 90, No. 3, pp. 1242–1249, Aug. 1, 2001.

* cited by examiner

*Primary Examiner*—Michael S. Lebentritt
(74) *Attorney, Agent, or Firm*—McDermott, Will & Emery

(57) ABSTRACT

A highly reliable semiconductor laser device having a low operating voltage is obtained by increasing adhesive force of the overall electrode layer to a nitride-based semiconductor layer without deteriorating a low contact property. This nitride-based semiconductor laser device comprises a nitride-based semiconductor layer formed on an active layer and an electrode layer formed on the nitride-based semiconductor layer, while the electrode layer includes a first electrode layer containing a material having strong adhesive force to the nitride-based semiconductor layer and a second electrode layer, formed on the first electrode layer, having weaker adhesive force to the nitride-based semiconductor layer than the first electrode layer for reducing contact resistance of the electrode layer with respect to the nitride-based semiconductor layer. Thus, the adhesive force of the overall electrode layer to the nitride-based semiconductor layer is increased due to the first electrode layer, and lower contact resistance is attained due to the second electrode layer. Therefore, the device can be improved in reliability and reduced in operating voltage.

38 Claims, 23 Drawing Sheets

US 6,743,702 B2

NITRIDE-BASED SEMICONDUCTOR LASER DEVICE AND METHOD OF FORMING THE SAME

BACKGROUND OF THE INVENTION

1. Field of the Invention

The present invention relates to a nitride-based semiconductor laser device and a method of forming the same, and more particularly, it relates to a nitride-based semiconductor laser device including an electrode layer and a method of forming the same.

2. Description of the Prior Art

A nitride-based semiconductor laser device is recently expected for application to a light source for a future large capacity optical disk, and actively developed. In order to reduce the operating voltage of the nitride-based semiconductor laser device and improve the reliability thereof, the contact resistance of an electrode must inevitably be reduced. In particular, a nitride-based semiconductor has low p-type carrier concentration, and hence it is difficult to attain an excellent ohmic property (low contact resistance) in relation to a p-side electrode. Therefore, a Pd-based electrode material such as a Pd/Au electrode or a Pd/Pt/Au electrode containing Pd having an excellent ohmic property is recently employed as the p-side electrode.

FIG. 35 is a sectional view showing a first conventional nitride-based semiconductor laser device having a Pd-based electrode. The structure of the first conventional nitride-based semiconductor laser device is now described with reference to FIG. 35. In the first conventional nitride-based semiconductor laser device, an AlGaN low-temperature buffer layer 202 of about 15 nm in thickness is formed on a sapphire substrate 201. An undoped GaN layer 203 of about 3 µm in thickness is formed on the AlGaN low-temperature buffer layer 202. An n-type GaN contact layer 204 is formed on the undoped GaN layer 203 in a thickness of about 5 µm. An n-type AlGaN cladding layer 205 of about 1 µm in thickness, an MQW (multiple quantum well) active layer 206, consisting of InGaN, of about 50 nm in thickness and a p-type AlGaN cladding layer 207 of about 300 nm in thickness having a convex portion are formed on the n-type GaN contact layer 204. A p-type GaN contact layer 208 of about 70 nm in thickness is formed on the convex portion of the p-type AlGaN cladding layer 207.

A p-side electrode 209 consisting of a Pd-based electrode having a three-layer structure formed by stacking a Pd layer of about 10 nm in thickness, an Au layer of about 100 nm in thickness and an Ni layer of about 200 nm in thickness in ascending order is formed on the p-type GaN contact layer 208. An SiO$_2$ film 210 is formed to cover the upper surface of the p-side electrode 209 and regions excluding part of the upper surface of the n-type GaN contact layer 204. A pad electrode 211 is formed to cover the SiO$_2$ film 210 and come into contact with the upper surface of the p-side electrode 209.

The layers from the p-type AlGaN cladding layer 207 to the n-type GaN contact layer 204 are partially removed. An n-side electrode 212 is formed to come into contact with the exposed upper surface of the n-type GaN contact layer 204. A pad electrode 213 is formed to come into contact with the n-side electrode 212.

FIGS. 36 to 40 are sectional views for illustrating a process of fabricating the first conventional nitride-based semiconductor laser device having the Pd-based electrode shown in FIG. 35. FIG. 41 is a sectional view showing the first conventional nitride-based semiconductor laser device shown in FIG. 35 mounted on a submount in a junction-up system from the substrate side. The term "junction-up system" stands for a system of mounting a nitride-based semiconductor laser device on a submount so that the distance between a substrate and the submount is smaller than that between an active layer and the submount. The fabrication process for the first conventional nitride-based semiconductor laser device having the Pd-based electrode is now described with reference to FIGS. 35 to 41.

First, the AlGaN low-temperature buffer layer 202 is grown on the sapphire substrate 201 by MOCVD (metal organic chemical vapor deposition) under a low-temperature condition of about 600° C. in a thickness of about 15 nm, in order to relax lattice mismatching. The undoped GaN layer 203 is formed on the AlGaN low-temperature buffer layer 202 by MOCVD in a thickness of about 3 µm.

Thereafter the n-type GaN contact layer 204 of about 5 µm in thickness, the n-type AlGaN cladding layer 205 of about 1 µm in thickness, the MQW active layer 206, consisting of InGaN, of about 50 nm in thickness, the p-type AlGaN cladding layer 207 of about 300 nm in thickness and the p-type GaN contact layer 208 of about 70 nm in thickness are successively formed on the undoped GaN layer 203 by MOCVD.

Then, the layers from the p-type GaN contact layer 208 to the n-type GaN contact layer 204 are partially removed by anisotropic dry etching, as shown in FIG. 37.

Then, a multilayer film of a Pd layer of about 10 nm in thickness, an Au layer of about 100 nm in thickness and an Ni layer of about 200 nm in thickness stacked in ascending order is formed in a striped shape of about 2 µm in width by a lift off method or the like, thereby forming the p-side electrode 209 consisting of the Pd-based electrode having the three-layer structure of the Pd layer, the Au layer and the Ni layer, as shown in FIG. 38. Thereafter the uppermost Ni layer forming the p-side electrode 209 is employed as an etching mask for etching the p-type GaN contact layer 208 while etching the p-type AlGaN cladding layer 207 by about 150 nm by anisotropic dry etching with CF$_4$ gas. Thus, a ridge portion shown in FIG. 39 is formed.

Then, the SiO$_2$ film 210 is formed on the overall surface by plasma CVD and partially removed from a portion of the n-type GaN contact layer 204, as shown in FIG. 40. The n-side electrode 212 is formed on the portion of the n-type GaN contact layer 204 from which the SiO$_2$ film 210 is removed.

Then, part of the SiO$_2$ film 210 located on the upper surface of the p-side electrode 209 consisting of the Pd-based electrode is removed, followed by formation of the pad electrodes 211 and 213 on the p-side electrode 209 and the n-side electrode 212 respectively, as shown in FIG. 35.

The nitride-based semiconductor laser device shown in FIG. 35 is fixed onto a submount (radiation base) 270 fixed to a stem 271 with a fusible material 260 such as solder, as shown in FIG. 41. In this case, the surface (the back surface of the sapphire substrate 201) of the device opposed to the ridge portion is fused to the submount 270 in the junction-up system.

The first conventional nitride-based semiconductor laser device having the p-side electrode 209 consisting of the Pd-based electrode is formed in the aforementioned manner.

In the aforementioned first conventional nitride-based semiconductor laser device having the p-side electrode 209 consisting of the Pd-based electrode, however, the adhesive force of the p-side electrode 209 consisting of the Pd-based electrode to the p-type GaN contact layer 208 is so weak that the p-side electrode 209 consisting of the Pd-based electrode disadvantageously readily peels off in an intermediate stage of the fabrication process. Therefore, it is difficult to improve the reliability of the device.

In the first conventional nitride-based semiconductor laser device having the p-side electrode 209 consisting of the Pd-based electrode, further, heat or stress disadvantageously deteriorates the contact characteristic of the p-side electrode 209 in the step of forming the pad electrode 211 on the p-side electrode 209 or in an assembling step. In this case, contact resistance is increased to disadvantageously increase the operating voltage.

FIG. 42 is a sectional view showing the structure of a second conventional nitride-based semiconductor laser device 350. Referring to FIG. 42, an n-type GaN contact layer 302 of about 5 µm in thickness is formed on a sapphire substrate 301 in the second conventional nitride-based semiconductor laser device 350. An n-type cladding layer 303, consisting of n-type AlGaN, of about 1 µm in thickness and an active layer 304 of about 0.1 µm in thickness are formed on the n-type GaN contact layer 302. A p-type cladding layer 305, consisting of p-type AlGaInN, having a projection is formed on the active layer 304. A p-type GaN contact layer 306 is formed on the projection of the p-type cladding layer 305. The projection of the p-type cladding layer 305 and the p-type GaN contact layer 306 form a ridge portion of about 0.5 µm in thickness. A p-side electrode 310 of about 0.5 µm in thickness is formed on the upper surface of the ridge portion, to come into contact with the p-type GaN contact layer 306.

The layers from the p-type cladding layer 305 to the n-type GaN contact layer 302 are partially removed. A current blocking layer 307 is formed to cover part of the exposed upper surface of the n-type GaN contact layer 302, the side surfaces of the n-type cladding layer 303, the active layer 304 and the p-type cladding layer 305 and the upper surface of the p-type cladding layer 305 while exposing the upper surface of the p-side electrode 310. A p-side pad electrode 311 of about 0.4 µm in thickness is formed on the current blocking layer 307, to cover the ridge portion and come into contact with the p-side electrode 310 on the upper surface of the ridge portion.

An n-side electrode 312 is formed on the surface of the n-type GaN contact layer 302 exposed due to the partial removal of the layers from the p-type cladding layer 305 to the n-type GaN contact layer 302. An n-side pad electrode 313 is formed on the n-side electrode 312.

In the second conventional nitride-based semiconductor laser device 350 having the aforementioned structure, a current flows from the p-side pad electrode 311 to the active layer 304, the n-type cladding layer 303, the n-type GaN contact layer 302, the n-side electrode 312 and the n-side pad electrode 313 through the p-side electrode 310 as well as the p-type GaN contact layer 306 and the p-type cladding layer 305 forming the ridge portion. Thus, the nitride-based semiconductor laser device 350 can generate a laser beam in a region of the active layer 304 located under the ridge portion.

When employed as a light source for a rewritable optical disk, the second conventional nitride-based semiconductor laser device 350 having the aforementioned structure must perform a high-output operation with an optical output of about or at least 30 mW. When the nitride-based semiconductor laser device 350 performs a high-output operation, however, the heating value is generally increased to disadvantageously deteriorate the life of the nitride-based semiconductor laser device 350.

In order to radiate heat caused by the high-output operation of the nitride-based semiconductor laser device 350, therefore, a method of assembling the laser device 350 in close contact with a submount (radiation base) or a stem is employed so that the distance between the active layer 304 and the submount or the stem is smaller than that between the sapphire substrate 301 and the submount or the stem. This fixing method is referred to as a junction-down method. In particular, the nitride-based semiconductor laser device 350 having a higher operating voltage than an AlGaAs-based infrared semiconductor laser device or an AlGaInP-based red semiconductor laser device exhibits a high heating value. In order to operate the nitride-based semiconductor laser device 350 with a high output, therefore, junction-down assembly excellent in heat radiation is necessary.

FIG. 43 is a schematic diagram showing the second conventional nitride-based semiconductor laser device 350 in a state assembled in the junction-down system. Referring to FIG. 43, the second conventional nitride-based semiconductor laser device 350 is fixed to a submount 370 with a fusible material 360. The submount 370 is fixed to a stem 371.

When the aforementioned second conventional nitride-based semiconductor laser device 350 is assembled in the junction-down system, however, the active layer (emission part) 304 of the nitride-based semiconductor laser device 350 is disadvantageously covered with the fusible material 360 due to the small distance between the active layer 304 and the fusible material 360. This problem is now described in detail.

An infrared laser or a red laser can strongly confine light in an active layer since the difference between the refractive indices of the active layer and a cladding layer can be increased. Therefore, the distance between the active layer (emission part) and a fusible material can be increased by providing a contact layer having a large thickness. Thus, the aforementioned problem of the active layer (emission part) covered with the fusible material can be solved.

In the nitride-based semiconductor laser device 350, however, the difference between the refractive indices of the p-type GaN contact layer 306 employed as a contact layer and the p-type cladding layer 305 and that of the active layer 304 is not so large. When increased in thickness, therefore, the p-type GaN contact layer 306 functions as a light guide layer to readily generate a higher mode. This leads to such a new problem that it is difficult to mode-control the nitride-based semiconductor laser device 350. Therefore, it is difficult to increase the thickness of the p-type GaN contact layer 306 in the second conventional nitride-based semiconductor laser device 350. Consequently, it is generally difficult to solve the problem of the active layer (emission part) 304 of the nitride-based semiconductor laser device 350 covered with the fusible material 360.

FIGS. 44 to 46 are sectional views for illustrating problems caused in the second conventional nitride-based wee, semiconductor laser device 350 assembled in the junction-down system. In order to mount the second conventional nitride-based semiconductor laser device 350 on the submount 370, the upper surface of the p-side pad electrode 311 is pressed against and fused to the submount 370 with the fusible material 360 such as solder under heat and a pressure. At this time, the fusible material 360 partially creeps up along the front end surface of the nitride-based semiconductor laser device 350 closer to the ridge portion as shown in FIG. 44, due to the small distance between the active layer 304 and the upper surface of the p-side pad electrode 311. In general, therefore, the active layer 304 serving as an emission part is disadvantageously covered with the fusible material 360. In this case, the emission characteristic of the nitride-based semiconductor laser device 350 is disadvantageously deteriorated.

As shown in FIG. 45, part of the fusible material 360 further creeps up along the front end surface of the nitride-based semiconductor laser device 350 closer to the ridge portion up to p-n junction parts located on the upper and lower surfaces of the active layer 304 serving as the emission part, to disadvantageously cause shorting. When shorted, the device 350 is disadvantageously rendered inoperable. As shown in FIG. 46, further, part of the fusible material 360 may creep up along the side surface of the nitride-based semiconductor laser device 350 up to the n-type cladding layer (p-n junction part) 303 beyond the active layer 304, to cause shorting.

When the nitride-based semiconductor laser device 350 is deteriorated in emission characteristic or defectively shorted as shown in FIGS. 44 to 46, the yield of junction-down assembly is disadvantageously reduced.

In general, further, the distance between the ridge portion and the upper surface of the p-side pad electrode 311 is so small that the heat and the pressure for fusing the fusible material 360 are readily transmitted to the ridge portion, as shown in FIGS. 44 to 46. Therefore, the operating voltage of the nitride-based semiconductor laser device 350 is increased due to the heat and the pressure. Consequently, the heating value is increased in operation. Therefore, the life of the nitride-based semiconductor laser device 350 is disadvantageously reduced.

Also when the second conventional nitride-based semiconductor laser device 350 is directly fixed to a stem (not shown), the active layer 304 or the n-type cladding layer 303 located on the active layer 304 is disadvantageously covered with a fusible material for fixing the nitride-based semiconductor laser device 350 to the stem. Thus, the nitride-based semiconductor laser device 350 is deteriorated in emission characteristic or defectively shorted also in this case.

In general, a method of reducing the thickness of the fusible material 360 deposited to the submount 370 so that the active layer 304 is not covered with the fusible material 360 or a method of reducing the amount of the pellet-type fusible material 360 when directly fixing the nitride-based semiconductor laser device 350 to the stem is proposed. According to this method, however, the nitride-based semiconductor laser device 350 cannot be reliably fused to the submount 370, leading to such another problem that the nitride-based semiconductor laser device 350 peels off from the submount 370. Also in this case, therefore, the yield of junction-down assembly is disadvantageously reduced.

SUMMARY OF THE INVENTION

The present invention has been proposed in order to solve the aforementioned problems.

An object of the present invention is to provide a nitride-based semiconductor laser device having a low operating voltage and high reliability.

Another object of the present invention is to increase the adhesive force of the overall electrode layer to a nitride-based semiconductor layer without damaging a low contact property in the aforementioned nitride-based semiconductor laser device.

Still another object of the present invention is to provide a method of forming a nitride-based semiconductor laser device capable of readily forming a nitride-based semiconductor laser device having a low operating voltage and high reliability.

A further object of the present invention is to provide a nitride-based semiconductor laser apparatus capable of improving the yield of junction-down assembly.

A further object of the present invention is to provide a nitride-based semiconductor laser apparatus capable of preventing reduction of a device life.

A further object of the present invention is to provide a nitride-based semiconductor laser apparatus capable of preventing deterioration of a light emission characteristic in junction-down assembly.

A further object of the present invention is to provide a nitride-based semiconductor laser apparatus capable of preventing shorting in junction-down assembly.

A nitride-based semiconductor laser device according to a first aspect of the present invention comprises a nitride-based semiconductor layer formed on an active layer and an electrode layer formed on the nitride-based semiconductor layer, while the electrode layer includes a first electrode layer containing a material having strong adhesive force to the nitride-based semiconductor layer and a second electrode layer, formed on the first electrode layer, having weaker adhesive force to the nitride-based semiconductor layer than the first electrode layer for reducing contact resistance of the electrode layer with respect to the nitride-based semiconductor layer.

In the nitride-based semiconductor laser device according to the first aspect, the first electrode layer containing the material having strong adhesive force to the nitride-based semiconductor layer is provided on the nitride-based semiconductor layer while the second electrode layer reducing the contact resistance of the electrode layer with respect to the nitride-based semiconductor layer is provided on the first electrode layer as hereinabove described, whereby the adhesive force of the overall electrode layer to the nitride-based semiconductor layer can be increased due to the first electrode layer and low contact resistance can be attained due to the second electrode layer. Thus, the device can be improved in reliability and reduced in operating voltage.

In the nitride-based semiconductor laser device according to the aforementioned first aspect, the second electrode layer preferably has lower contact resistance with respect to the nitride-based semiconductor layer than the first electrode layer. According to this structure, low contact resistance can be readily attained due to the second electrode layer. The first electrode layer preferably has a thickness of not more than 3 nm. When the first electrode layer is formed with such a small thickness of not more than 3 nm, the adhesive force of the overall electrode layer to the nitride-based semiconductor layer can be increased due to the first electrode layer without deteriorating the low contact property of the second electrode layer.

In the nitride-based semiconductor laser device according to the aforementioned first aspect, the first electrode layer preferably contains at least one material selected from a group consisting of Pt, Ni, Cr, Ti, Hf and Zr, and the second electrode layer preferably contains Pd. According to this structure, the adhesive force of the overall electrode layer to the nitride-based semiconductor layer can be readily increased due to the first electrode layer while low contact resistance can be readily attained due to the second electrode layer. In this case, the first electrode layer more preferably includes a Pt layer, and the second electrode layer more preferably includes a multilayer film having a Pd layer. In this case, the uppermost layer of the second electrode layer preferably includes a metal layer serving as an etching mask. According to this structure, the uppermost layer of the second electrode layer can be employed as an etching mask for forming a ridge portion, whereby no additional etching mask may be formed. Consequently, the fabrication process can be simplified.

The aforementioned nitride-based semiconductor laser device preferably further comprises a mixed layer, formed between the first and second electrode layers, including a Pt layer and a Pd layer. According to this structure, the Pd layer is formed closer to the nitride semiconductor layer, so that the contact resistance can be reliably reduced with Pd.

In the aforementioned nitride-based semiconductor laser device, the nitride-based semiconductor layer preferably has an irregular surface. According to this structure, the contact area between the nitride-based semiconductor layer and the first electrode layer can be increased, whereby the contact resistance can be further reduced. In this case, the nitride-based semiconductor layer having the irregular surface has an In composition of at least 3% and a thickness of not more than 20 nm. When the nitride-based semiconductor layer is formed with such a composition in such a thickness, the surface of the nitride-based semiconductor layer can be readily irregularized.

In the aforementioned nitride-based semiconductor laser device, the nitride-based semiconductor layer preferably includes a contact layer formed on a convex portion of a cladding layer, and the convex portion of the cladding layer and the contact layer form a ridge portion. According to this structure, the electrode layer must be formed on the contact layer having a narrow area. Also in this case, the adhesive force of the overall electrode layer to the contact layer forming the ridge portion can be increased due to the first electrode layer while low contact resistance can be attained due to the second electrode layer, whereby the device can be improved in reliability and reduced in operating current and operating voltage.

The aforementioned nitride-based semiconductor laser device preferably further comprises a base for mounting an element including the nitride-based semiconductor layer, the first electrode layer and the second electrode layer from the side of the active layer. According to this structure, heat generated from the active layer in emission can be excellently radiated through the base. In such junction-down assembly, the electrode layer tends to peel due to stress readily applied to the ridge portion. According to the present invention, the adhesive force of the overall electrode layer to the nitride-based semiconductor layer can be increased due to the first electrode layer, whereby the electrode layer can be effectively prevented from peeling also in junction-down assembly.

A nitride-based semiconductor laser device according to a second aspect of the present invention comprises a nitride-based semiconductor layer formed on an active layer and an electrode layer formed on the nitride-based semiconductor layer, while the electrode layer includes a first electrode layer containing a material having strong adhesive force to the nitride-based semiconductor layer and a second electrode layer, formed on the first electrode layer, having weaker adhesive force to the nitride-based semiconductor layer than the first electrode layer for reducing an energy barrier of the electrode layer against the nitride-based semiconductor layer.

In the nitride-based semiconductor laser device according to the second aspect, the first electrode layer containing the material having strong adhesive force to the nitride-based semiconductor layer is provided on the nitride-based semiconductor layer and the second electrode layer reducing the energy barrier of the electrode layer against the nitride-based semiconductor layer is provided on the first electrode layer as hereinabove described, whereby the adhesive force of the overall electrode layer to the nitride-based semiconductor layer can be increased due to the first electrode layer and low contact resistance can be attained due to the second electrode layer. Therefore, the device can be improved in reliability and reduced in operating voltage.

A method of forming a nitride-based semiconductor laser device according to a third aspect of the present invention comprises steps of forming a nitride-based semiconductor layer on an active layer and forming an electrode layer on the surface of the nitride-based semiconductor layer, while the step of forming the electrode layer includes steps of forming a first electrode layer containing a material having strong adhesive force to the nitride-based semiconductor layer and forming a second electrode layer having weaker adhesive force to the nitride-based semiconductor layer than the first electrode layer for reducing contact resistance of the electrode layer with respect to the nitride-based semiconductor layer on the first electrode layer.

In the method of forming a nitride-based semiconductor laser device according to the third aspect, the first electrode layer containing the material having strong adhesive force to the nitride-based semiconductor layer is formed on the surface of the nitride-based semiconductor layer and the second electrode layer reducing the contact resistance of the electrode layer with respect to the nitride-based semiconductor layer is formed on the first electrode layer as hereinabove described, whereby the adhesive force of the overall electrode layer to the nitride-based semiconductor layer can be increased due to the first electrode layer and low contact resistance can be attained due to the second electrode layer. Thus, the device can be improved in reliability, and a nitride-based semiconductor laser device reducible in operating voltage can be readily formed.

In the method of forming a nitride-based semiconductor laser device according to the aforementioned third aspect, the second electrode layer preferably has lower contact resistance with respect to the nitride-based semiconductor layer than the first electrode layer. According to this structure, low contact resistance can be readily attained due to the second electrode layer. The first electrode layer preferably has a thickness of not more than 3 nm. When the first electrode layer is formed with such a small thickness of not more than 3 nm, the adhesive force of the overall electrode layer to the nitride-based semiconductor layer can be increased due to the first electrode layer without deteriorating the low contact property of the second electrode layer.

In the method of forming a nitride-based semiconductor laser device according to the third aspect, the step of forming the first electrode layer on the surface of the nitride-based semiconductor layer preferably includes a step of forming the first electrode layer and the second electrode layer on the surface of the nitride-based semiconductor layer and thereafter feeding a current between the second electrode layer and the nitride-based semiconductor layer thereby partially moving material included in the second electrode layer to a portion close to the surface of the nitride-based semiconductor layer. According to this structure, the second electrode layer can further exhibit the low-contact property without reducing the adhesive force to the nitride-based semiconductor layer improved by the first electrode layer.

In the aforementioned method of forming a nitride-based semiconductor laser device, the step of forming the first electrode layer preferably includes a step of forming the first electrode layer by any of electron beam heating evaporation, resistance heating evaporation and sputtering evaporation. When such evaporation is employed, the first electrode layer containing the material having strong adhesive force to the nitride-based semiconductor layer can be readily formed.

In the aforementioned method of forming a nitride-based semiconductor laser device, the nitride-based semiconductor layer preferably includes a contact layer formed on a cladding layer, the step of forming the second electrode layer preferably includes a step of forming the second electrode layer on a prescribed region of the upper surface of the first electrode layer by a lift off method, and the method preferably further comprises a step of forming a ridge portion by partially etching the first electrode layer, the contact layer and the cladding layer through the second electrode layer serving as a mask after forming the second electrode layer. According to this structure, the ridge portion consisting of a convex portion of the cladding layer and the contact layer can be readily formed. When the first electrode layer is patterned not by the lift off method but by etching, pattern peeling readily caused in the lift off method can be prevented.

In the aforementioned method of forming a nitride-based semiconductor laser device, the first electrode layer preferably contains at least one material selected from a group consisting of Pt, Ni, Cr, Ti, Hf and Zr, and the second electrode layer preferably contains Pd. According to this structure, the adhesive force of the overall electrode layer to the nitride-based semiconductor layer can be readily increased due to the first electrode layer and low contact resistance can be readily attained due to the second electrode layer.

In the aforementioned method of forming a nitride-based semiconductor laser device, the step of forming the nitride-based semiconductor layer preferably includes a step of forming the nitride-based semiconductor layer having an irregular surface. According to this structure, the contact area between the nitride-based semiconductor layer and the first electrode layer can be increased, whereby the contact resistance can be further reduced. In this case, the nitride-based semiconductor layer having the irregular surface preferably has an In composition of at least 3% and a thickness of not more than 20 nm. When the nitride-based semiconductor layer is formed with such a composition in such a thickness, the surface of the nitride-based semiconductor layer can be readily irregularized.

A nitride-based semiconductor laser apparatus according to a fourth aspect of the present invention comprises a nitride-based semiconductor layer having an active layer and a ridge potion formed on the active layer and a first electrode layer, formed to come into contact with an exposed upper surface of the ridge portion, having a thickness larger than the distance between the lower surface of a cladding layer located under the active layer and the upper surface of the ridge portion.

The nitride-based semiconductor laser apparatus according to the fourth aspect is provided with the first electrode layer having the thickness larger than the distance between the lower surface of the cladding layer located under the active layer and the upper surface of the ridge portion, thereby increasing the distance between the active layer and the upper surface of the first electrode layer. When the upper surface of the first electrode layer is fixed to a base for heat radiation with a fusible material, therefore, the distance between the fusible material and the active layer is so increased that the active layer (emission part) can be prevented from being covered with the fusible material. Consequently, the nitride-based semiconductor laser apparatus can be prevented from deterioration of the emission characteristic. The distance between the fusible material and the active layer is increased, whereby p-n junction parts located on the upper and lower surfaces of the active layer (emission part) can be prevented from being covered with the fusible material. Consequently, the nitride-based semiconductor laser apparatus can be prevented from shorting. The nitride-based semiconductor laser apparatus can be prevented from deterioration of the emission characteristic and shorting as described above, whereby the assembly yield can be improved. The distance between the fusible material and the active layer is increased, whereby the thickness of the fusible material layer or the quantity of the fusible material can be increased within the range not covering the active layer (emission part). Thus, a laser device including the nitride-based semiconductor layer and the first electrode layer can be reliably fused to the base for heat radiation, whereby the laser device can be effectively prevented from peeling off from the base. Thus, the assembly yield can be improved.

The distance between the ridge portion and the upper surface of the first electrode layer is also increased, whereby heat is hardly transmitted to the ridge portion when the first electrode layer is fused with the fusible material, while a pressure transmitted to the ridge portion can be absorbed due to the increased thickness of the first electrode layer consisting of a relatively soft material. Thus, the operating voltage of the nitride-based semiconductor laser apparatus can be prevented from being increased by heat and the pressure in fusion, whereby increase of the heating value can be prevented. Consequently, the nitride-based semiconductor laser apparatus can be prevented from reduction of the device life.

In the nitride-based semiconductor laser apparatus according to the aforementioned fourth aspect, the first electrode layer may include a first metal layer coming into contact with the ridge portion and a second metal layer formed on the first metal layer so that its surface is exposed, and the second metal layer may have a larger thickness than the first metal layer. According to this structure, the first metal layer and the second metal layer having a larger thickness than the first metal layer can readily increase the thickness of the first electrode layer. Thus, the distance between the fusible material and the active layer can be increased when fixing the upper surface of the first electrode layer to the base for heat radiation with the fusible material. In this case, the second metal layer preferably includes a p-side pad electrode consisting of Au. According to this structure, a pressure transmitted to the ridge potion can be absorbed due to the increased thickness of the p-side pad electrode consisting of Au, which is a relatively soft material. Thus, increase of the operating voltage resulting from the pressure in fusion can be prevented, whereby increase of the heating value can also be prevented. Consequently, the nitride-based semiconductor laser apparatus can be prevented from reduction of the device life.

The aforementioned nitride-based semiconductor laser apparatus further comprises a current blocking layer formed to cover regions excluding the upper surface of the ridge portion, and the first metal layer is formed not only on the ridge portion but also on the current blocking layer. According to this structure, the contact area between the first and second metal layers is increased, whereby heat can be excellently radiated from the first metal layer to the second metal layer. In this case, the nitride-based semiconductor laser apparatus preferably further comprises a contact layer, consisting of a nitride-based semiconductor, formed on the ridge portion and the current blocking layer, and the first metal layer is preferably formed on the ridge portion and the current blocking layer through the contact layer. According to this structure, the contact area between the contact layer and the first metal layer is increased, whereby heat can be excellently radiated from the contact layer to the first metal layer. In the aforementioned nitride-based semiconductor laser apparatus, the first metal layer may include a multilayer film consisting of different metals.

In the nitride-based semiconductor laser apparatus according to the aforementioned fourth aspect, the first electrode layer may include a first metal layer coming into contact with the ridge portion and a second metal layer formed on the first metal layer so that its surface is exposed, and the first metal layer may have a larger thickness than the second metal layer. According to this structure, the second metal layer and the first metal layer having a larger thickness than the second metal layer can readily increase the thickness of the first electrode layer. Thus, the distance between the fusible material and the active layer can be increased when fixing the upper surface of the first electrode layer to the base for heat radiation with the fusible material. In this case, the first metal layer preferably includes a p-side electrode having an Au film larger in thickness than the second metal layer. According to this structure, a pressure transmitted to the ridge portion can be absorbed due to the increased thickness of the p-side electrode consisting of Au, which is a relatively soft material. Thus, increase of the operating voltage resulting from the pressure in fusion can be prevented, whereby increase of the heating value can also be increased. Consequently, the nitride-based semiconductor laser apparatus can be prevented from reduction of the device life. In this case, the first metal film may include a multilayer film consisting of different metals.

In the aforementioned nitride-based semiconductor laser apparatus, the first metal layer having a larger thickness than the second metal layer is preferably formed to project only on the upper surface of the ridge portion. According to this structure, the step between a projection on the ridge portion and the remaining potions is so increased that the ridge portion and an emission point located immediately under the ridge portion can be readily distinguished from each other. Consequently, the position of the emission point can be precisely controlled in junction-down assembly.

In the nitride-based semiconductor laser apparatus according to the aforementioned fourth aspect, the first electrode layer preferably includes a first metal layer coming into contact with the ridge portion, a second metal layer formed on the first metal layer and a third metal layer formed on the second metal layer, and the third metal layer preferably has a larger thickness than the first metal layer and the second metal layer. According to this structure, the first and second metal layers and the third metal layer having a larger thickness than the first and second metal layers can readily increase the thickness of the first electrode layer. Thus, the distance between the fusible material and the active layer can be increased when fixing the upper surface of the first electrode layer to the base for heat radiation with the fusible material.

In this case, the third metal layer preferably includes a p-side thick-film electrode having an Au film larger in thickness than the first metal layer and the second metal layer. According to this structure, the pressure transmitted to the ridge portion can be absorbed due to the increased thickness of the p-side thick-film electrode consisting of Au, which is a relatively soft material. Thus, the operating voltage can be prevented from being increased due to the pressure in fusion, whereby increase of the heating value can also be prevented. Consequently, the nitride-based semiconductor laser apparatus can be prevented from reduction of the device life.

In the aforementioned nitride-based semiconductor laser apparatus, each of the first metal layer, the second metal layer and the third metal layer may have a multilayer structure.

The nitride-based semiconductor laser apparatus according to the aforementioned fourth aspect preferably further comprises a current blocking layer formed to cover regions excluding the upper surface of the ridge portion, and the current blocking layer preferably includes either a nitride-based semiconductor having a conductivity type different from that of the ridge portion or an insulator film. In this case, the current blocking layer may include a current blocking layer consisting of an $SiO_2$ film, or a current blocking layer consisting of any material of AlGaN, InGaN and GaN having a conductivity type different from that of the ridge portion.

In the nitride-based semiconductor laser apparatus comprising the aforementioned current blocking layer, the current blocking layer may consist of a nitride-based semiconductor having a conductivity type different from that of the ridge portion, and the nitride-based semiconductor laser apparatus may further comprise a second electrode layer formed on a surface exposed by partially removing the nitride-based semiconductor layer and a protective film consisting of an insulator film formed on a side surface exposed by partially removing the nitride-based semiconductor layer. In this case, the current blocking layer may include a current blocking layer consisting of AlGaN, and the protective film may include a protective film consisting of $SiO_2$.

The nitride-based semiconductor laser apparatus according to the aforementioned fourth aspect preferably further comprises a base for mounting an element including the nitride-based semiconductor layer and the first electrode layer from the side of the active layer. According to this structure, heat from the active layer can be excellently radiated through the base in emission. In this case, the base may include a submount.

A nitride-based semiconductor laser apparatus according to a fifth aspect of the present invention comprises a nitride-based semiconductor layer having an active layer and a ridge portion formed on the active layer and a first electrode layer, formed to come into contact with an exposed upper surface of the ridge portion, having a thickness of at least 2 $\mu$m.

The nitride-based semiconductor laser apparatus according to the fifth aspect is provided with the first electrode layer having the large thickness of at least 2 $\mu$m coming into contact with the exposed upper surface of the ridge portion, thereby increasing the distance between the upper surface of the first electrode layer and the upper surface of the ridge portion. Thus, the distance between a fusible material and the active layer is increased when fixing the upper surface of the first electrode layer to a base for heat radiation with the fusible material, whereby the active layer (emission part) can be prevented from being covered with the fusible material. Consequently, the nitride-based semiconductor laser apparatus can be prevented from deterioration of the emission characteristic.

The distance between the fusible material and the active layer is increased, whereby p-n junction parts located on the upper and lower surfaces of the active layer (emission part) can be prevented from being covered with the fusible material. Consequently, the nitride-based semiconductor laser apparatus can be prevented from shorting. The nitride-based semiconductor laser apparatus can be prevented from deterioration of the emission characteristic and shorting as described above, whereby the assembly yield can be improved. The distance between the fusible material and the active layer is increased, whereby the thickness of the fusible material layer or the quantity of the fusible material can be increased within the range not covering the active layer (emission part). Thus, a laser device including the nitride-based semiconductor layer and the first electrode layer can be reliably fused to the base for heat radiation, whereby the laser device can be effectively prevented from peeling off from the base. Thus, the assembly yield can be improved.

The distance between the ridge portion and the upper surface of the first electrode layer is also increased, whereby heat is hardly transmitted to the ridge portion when the first electrode layer is fused with the fusible material, while a pressure transmitted to the ridge portion can be absorbed due to the increased thickness of the first electrode layer consisting of a relatively soft material. Thus, the operating voltage of the nitride-based semiconductor laser apparatus can be prevented from being increased by heat and the pressure in fusion, whereby increase of the heating value can be prevented. Consequently, the nitride-based semiconductor laser apparatus can be prevented from reduction of the device life.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
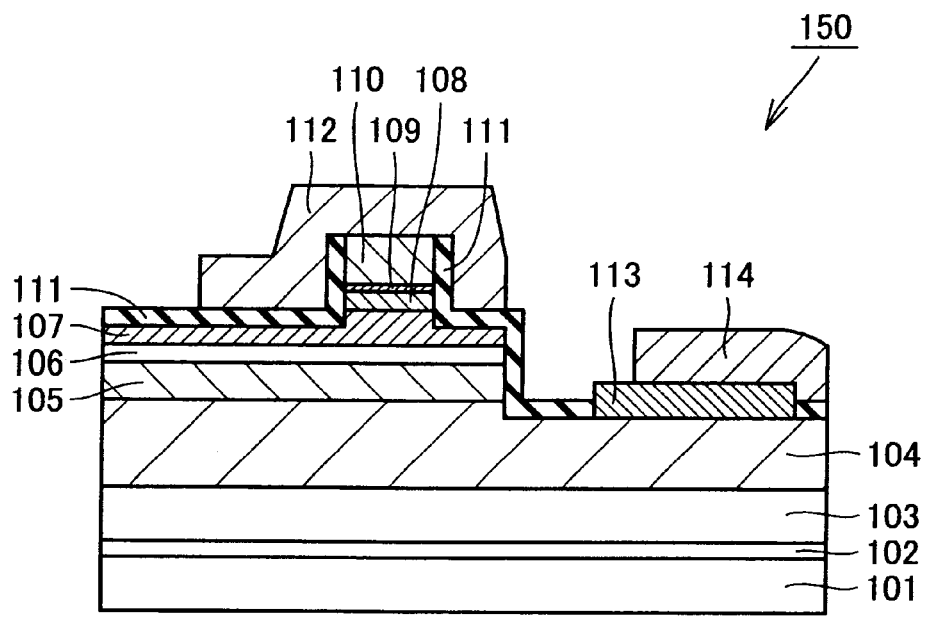
FIG. 1 is a sectional view showing a nitride-based semiconductor laser device according to a first embodiment of the present invention.

Embodiments of the present invention are now described with reference to the drawings.

(First Embodiment)

First, the structure of a nitride-based semiconductor laser device 150 according to a first embodiment of the present invention is described with reference to FIG. 1. According to the first embodiment, an AlGaN low-temperature buffer layer 102 of about 15 nm in thickness is formed on a sapphire substrate 101. An undoped GaN layer 103 of about 3 μm in thickness is formed on the AlGaN low-temperature buffer layer 102. An n-type GaN contact layer 104 of about 5 μm in thickness, an n-type AlGaN cladding layer 105 of about 1 μm in thickness, an MQW active layer 106, consisting of InGaN, of about 50 nm in thickness and a p-type AlGaN cladding layer 107 of about 300 nm in thickness having a convex portion are successively formed on the undoped GaN layer 103. A p-type GaN contact layer 108 of about 70 nm in thickness is formed on the convex portion of the p-type AlGaN cladding layer 107.

According to the first embodiment, a Pt electrode layer 109 of about 1 nm in thickness is formed on the p-type GaN contact layer 108. A Pd-based electrode layer 110 having a three-layer structure formed by stacking a Pd layer of about 17 nm in thickness, an Au layer of about 100 nm in thickness and an Ni layer of about 200 nm in thickness in ascending order is formed on the Pt electrode layer 109. The Pt electrode layer 109 and the Pd-based electrode layer 110 form a p-side electrode.

An SiO$_2$ film 111 is formed to cover regions excluding the upper surface of the Pd-based electrode layer 110 and part of the upper surface of the n-type GaN contact layer 104. A pad electrode 112 is formed to be in contact with the upper surface of the Pd-based electrode layer 110. An n-side electrode 113 is formed on the upper surface of the n-type GaN contact layer 104. A pad electrode 114 is formed to be in contact with the n-side electrode 113.

According to the first embodiment, the Pt electrode layer 109 consisting of Pt having strong adhesive force to the p-type GaN contact layer 108 is formed on the p-type GaN contact layer 108 and the Pd-based electrode layer 110 containing Pd having low contact resistance (interfacial energy barrier) with respect to the p-type GaN contact layer 108 is formed on the Pt electrode layer 109 as hereinabove described, whereby the adhesive force of the p-side electrode to the p-type GaN contact layer 109 can be increased due to the Pt electrode layer 109 and low contact resistance can be attained due to the Pd layer forming the Pd-based electrode layer 110.

In particular, the Pt electrode layer 109 is formed in the small thickness of about 1 nm, whereby the adhesive force of the overall p-side electrode to the p-type GaN contact layer 108 can be increased due to the Pt electrode layer 109 without deteriorating the low contact property of the Pd-based electrode layer 110. Thus, the operating voltage can be reduced and the reliability of the device 150 can be improved.

Figure 2:
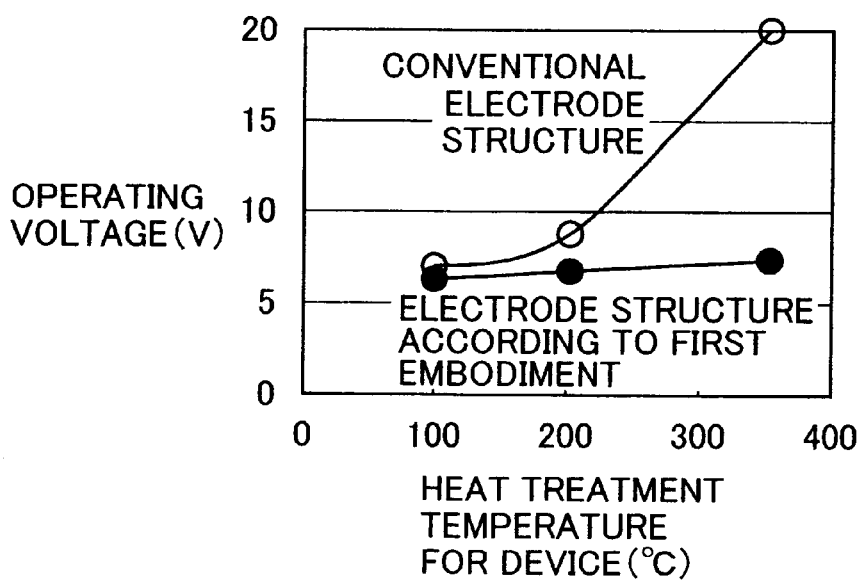
FIGS. 2 and 3 are characteristic diagrams for illustrating effects of the nitride-based semiconductor laser device according to the first embodiment shown in FIG. 1.

FIG. 2 shows change of the operating voltage of the nitride-based semiconductor laser device 150 subjected to heat treatment. In order to fix the nitride-based semiconductor laser chip onto a package and perform wiring by soldering, heat treatment of about 350° C. is necessary. When a conventional laser device including a Pd-based electrode (10 nm of Pd/100 nm of Au/200 nm of Ni) is subjected to heat treatment of 350° C. after preparation of the device, the operating voltage is increased from 7 V to 20 V due to deterioration of the ohmic property of the electrode, as shown in FIG. 2. On the other hand, the nitride-based semiconductor laser device 150 according to the first embodiment including the Pt electrode layer 109 and the Pd-based electrode layer 110 can maintain an excellent ohmic property also after the heat treatment of 350° C., whereby the operating voltage is hardly increased as shown in FIG. 2. Therefore, the nitride-based semiconductor laser device 150 according to the first embodiment can obtain a low operating voltage.

Figure 3:
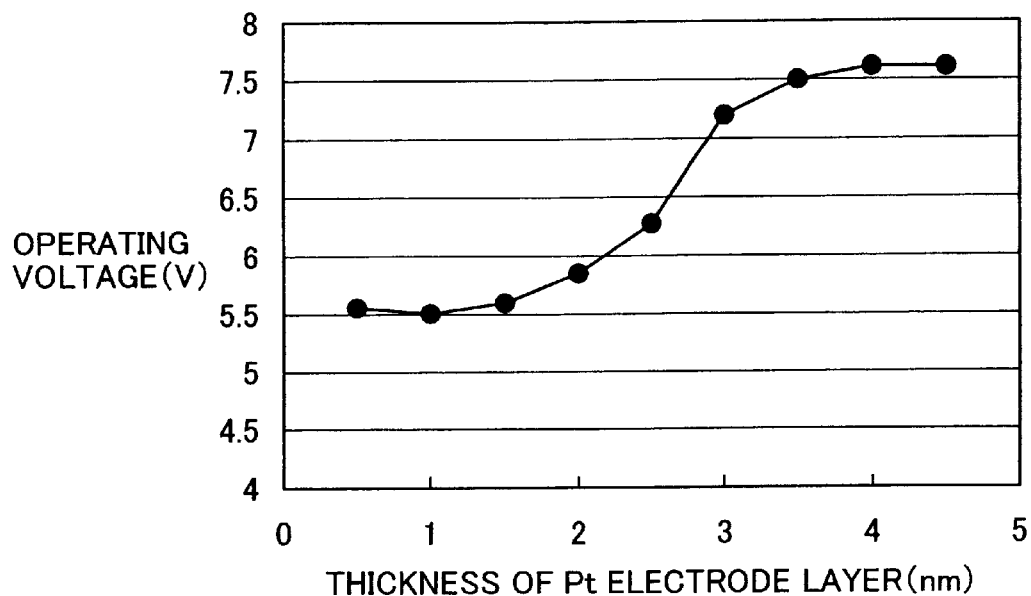
Figure 4:
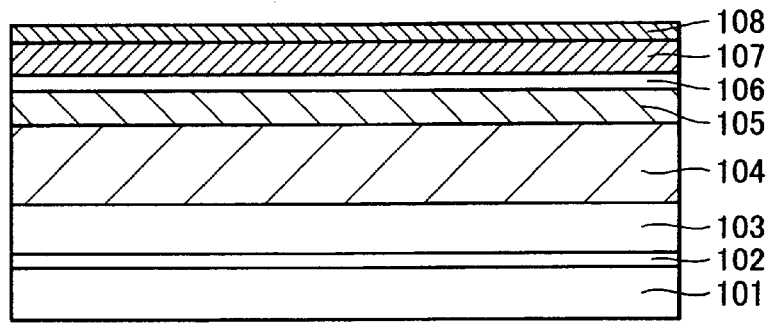
FIGS. 4 to 8 are sectional views for illustrating a process of fabricating the nitride-based semiconductor laser device according to the first embodiment shown in FIG. 1.

FIG. 3 shows the relation between the thickness of the Pt electrode layer 109 and the operating voltage. As clearly understood from FIG. 3, the operating voltage of the nitride-based semiconductor laser device 150 is increased when the thickness of the Pt electrode layer 109 exceeds 3 nm. Thus, it is understood that the thickness of the Pt electrode layer 109 must be set to not more than 3 nm, preferably not more than 2 nm in order to obtain a low operating voltage. According to the first embodiment, the thickness of the Pt electrode layer 109 is set to about 1 nm in consideration of this point.

A fabrication process for the nitride-based semiconductor laser device 150 according to the first embodiment is now described with reference to FIGS. 1 and 4 to 9.

First, the AlGaN low-temperature buffer layer 102 of about 15 nm in thickness is grown on the sapphire substrate 101 under a low-temperature condition of about 600° C. by MOCVD, in order to relax lattice mismatching. Thereafter the undoped GaN layer 103 is grown on the AlGaN low-temperature buffer layer 102 in the thickness of about 3 μm by MOCVD.

Figure 5:
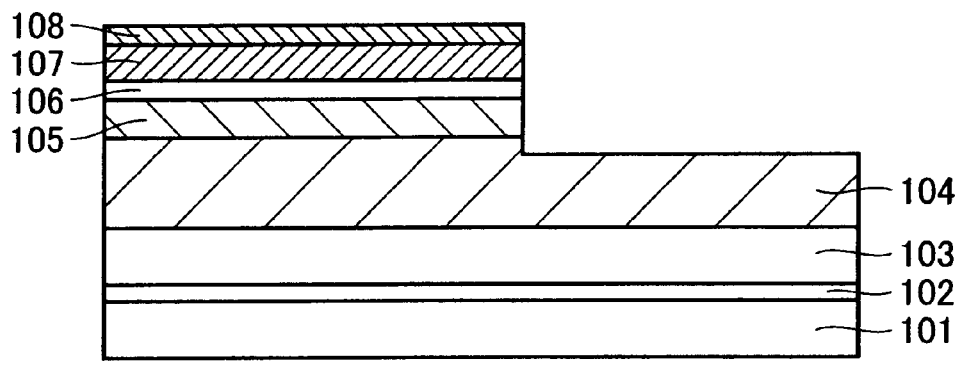
Figure 6:
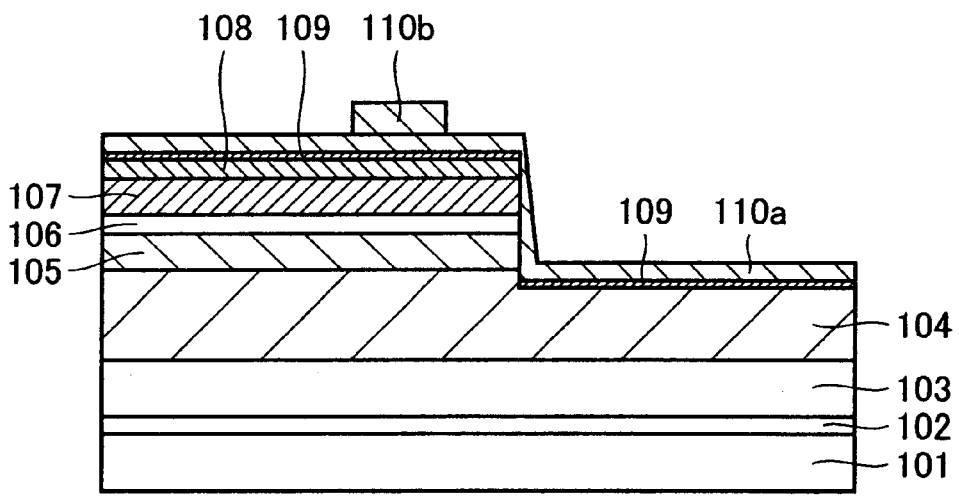

Thereafter the n-type GaN contact layer 104 of about 5 μm in thickness, the n-type AlGaN cladding layer 105 of about 1 μm in thickness, the MQW active layer 106 of about 50 nm in thickness, the p-type AlGaN cladding layer 107 of about 300 nm in thickness and the p-type GaN contact layer 108 of about 70 nm in thickness are successively formed on the undoped GaN layer 103 by MOCVD. Partial regions of the layers from the p-type GaN contact layer 108 to the n-type GaN contact layer 104 are removed by anisotropic dry etching, thereby partially exposing the n-type GaN contact layer 104 as shown in FIG. 5.

Then, cleaning is performed by aqua regia boiling, and the Pt electrode layer 109 is formed in the thickness of about 1 nm by EB evaporation while a Pd layer 110a is formed on the Pt electrode layer 109 in a thickness of about 7 nm. At this time, the substrate temperature in evaporation is increased to about 150° C., in order to uniformalize the thickness of the Pt electrode layer 109. Thereafter a multilayer film 110b consisting of a Pd layer of about 10 nm in thickness, an Au layer of about 100 nm in thickness and an Ni layer of about 200 nm in thickness stacked in ascending order is formed on a region corresponding to that formed with a ridge portion located on the Pd layer 110a in a striped (elongated) shape of about 2 μm in width by the lift off method.

Figure 7:
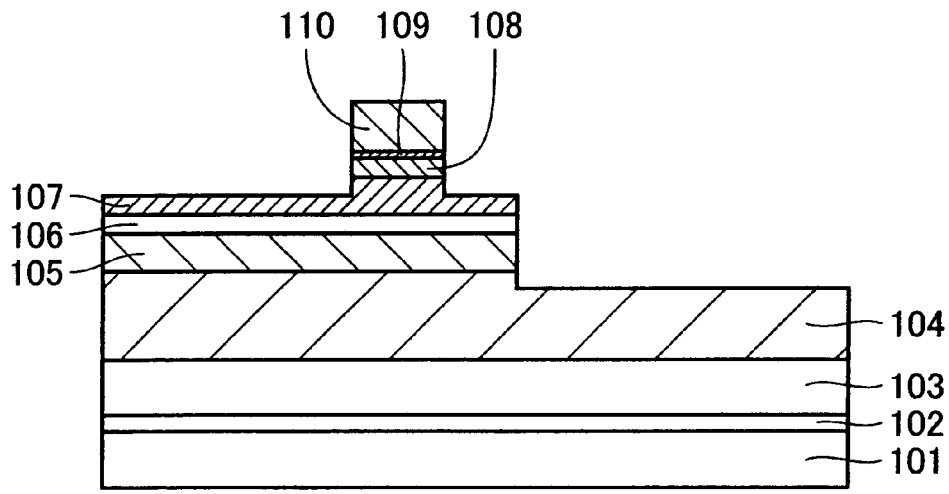

The uppermost Ni layer of the multilayer film 110b is employed as an etching mask for etching the Pd layer 110a, the Pt electrode layer 109 and the p-type GaN contact layer 108 while etching the p-type AlGaN cladding layer 107 by a thickness of about 150 nm by anisotropic dry etching employing CF$_4$ gas. Thus, the ridge portion is formed as shown in FIG. 7, along with formation of the Pt electrode layer 109 and the Pd-based electrode layer 110 having the Pd layer of about 17 nm in thickness, the Au layer of about 100 nm in thickness and the Ni layer of about 200 nm in thickness successively stacked in ascending order. The Pt electrode layer 109 and the Pd-based electrode layer 110 form the p-side electrode of the nitride-based semiconductor laser device 150 according to the first embodiment.

Figure 8:
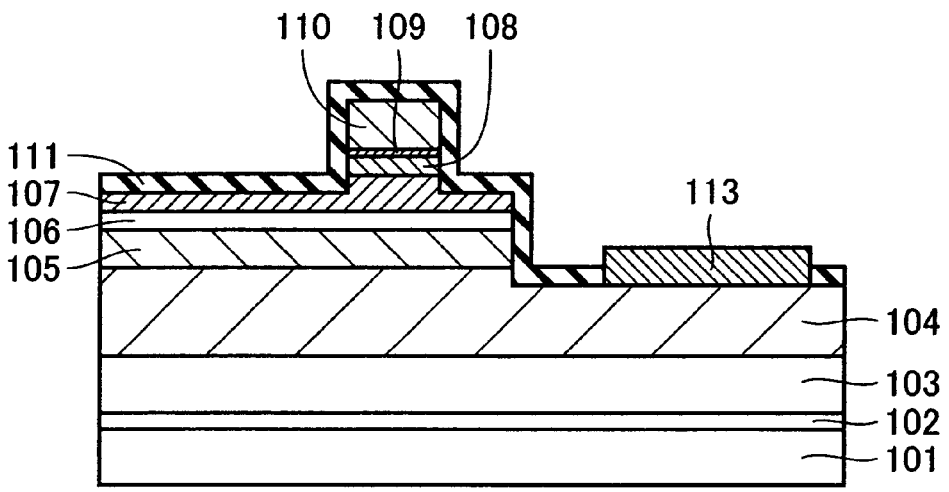

Then, the SiO$_2$ film 111 is deposited by plasma CVD and partially removed from part of the n-type GaN contact layer 104, as shown in FIG. 8. The n-side electrode 113 is formed on the part of the n-type GaN contact layer 104 from which the SiO₂ film 111 is removed.

Finally, the part of the SiO₂ film 111 located on the upper surface of the Pd-based electrode layer 110 is removed and thereafter the pad electrode 112 is formed to be in contact with the Pd-based electrode layer 110 while the pad electrode 114 is formed to be in contact with the n-side electrode 113, as shown in FIG. 1. Thus, the nitride-based semiconductor laser device 150 according to the first embodiment is formed.

In the fabrication process according to the first embodiment, as hereinabove described, the Pt electrode layer 109 having strong adhesive force is present between the Pd-based electrode layer 110 containing the low-contact material (low interfacial energy barrier material) Pd and the p-type GaN contact layer 108, whereby the Pd-based electrode layer 110 can reduce a voltage drop in the electrode part and the Pt electrode layer 109 can prevent peeling. Consequently, a highly reliable device having a low operating voltage can be formed. Pt, having contact resistance more readily influenced by the surface state of the semiconductor than Pd, is unstable. The first embodiment employs the multilayer structure of Pt/Pd for improving such unstability of Pt itself due to the presence of Pd without deteriorating the low contact property of Pd, whereby the contact resistance can be synergistically reduced.

In the fabrication process according to the first embodiment, the Pt electrode layer 109 and the Pd layer 110a are patterned not by the lift off method but by the method depositing the same on the overall surface and etching the same, whereby pattern peeling readily caused in the lift off method can be suppressed.

In the aforementioned fabrication process according to the first embodiment, further, contact resistance can be further reduced by performing cleaning with strong acid such as hydrochloric acid or aqua regia immediately before evaporating the electrode material (the Pt electrode layer 109).

Figure 9:
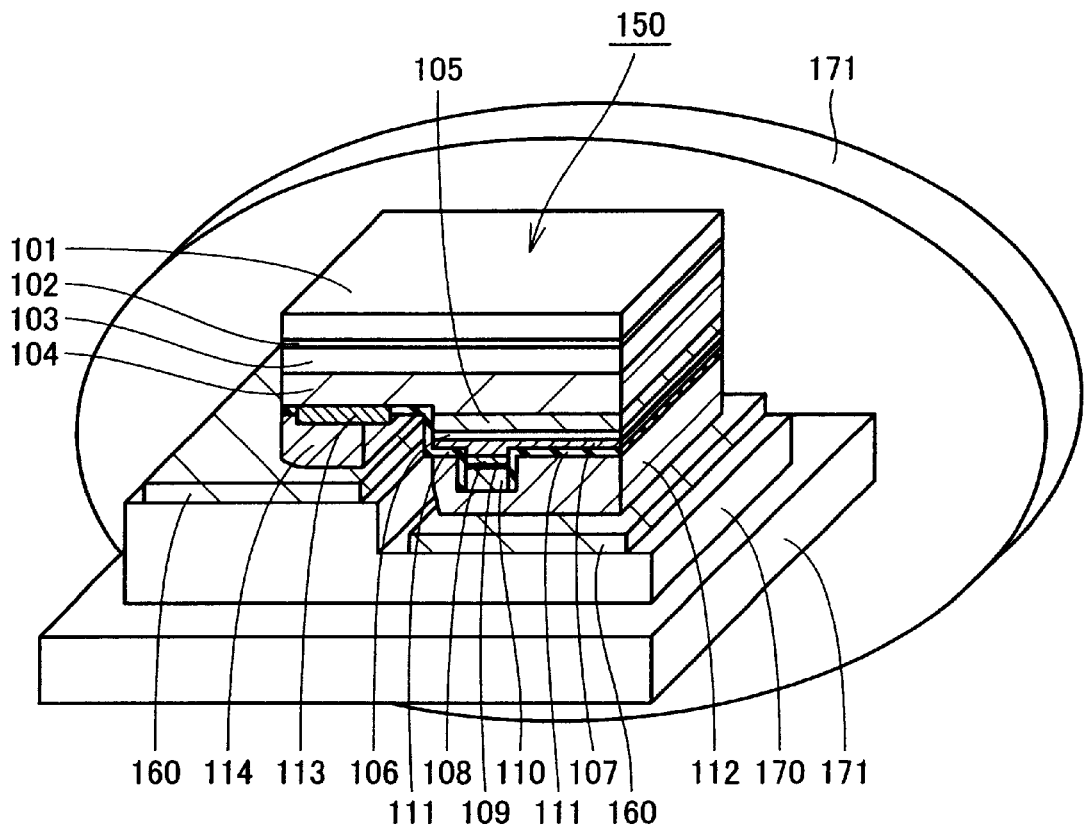
FIG. 9 is a perspective view showing the nitride-based semiconductor laser device according to the first embodiment shown in FIG. 1 in a state mounted on a submount in a junction-down system.

FIG. 9 shows the nitride-based semiconductor laser device 150 according to the first embodiment shown in FIG. 1 in a state mounted on a submount 170 provided on a stem 171 by a junction-down system from the side of the ridge portion. In the junction-down system, the nitride-based semiconductor laser device 150 according to the first embodiment is mounted on the submount 170 with a fusible material 160 such as solder. When the junction-down system is employed, a heat generating area of the MQW active layer 106 approaches the submount 170 as compared with the case of the junction-up system. In addition, no sapphire substrate inferior in heat conduction is interposed between the MQW active layer 106 and the submount 170 in the junction-down system, whereby the heat radiation characteristic of the device 150 can be improved. Consequently, a threshold current can be prevented from increase resulting from deterioration of the heat radiation characteristic, whereby the operating current and power consumption of the nitride-based semiconductor laser device 150 can be reduced.

According to the first embodiment, the adhesive force of the p-side electrode can be improved due to the Pt electrode layer 109, whereby the ohmic property of the p-side electrode can be inhibited from deterioration caused by heat or stress in fusion also when the junction-down system is employed. Thus, a device having an excellent heat radiation effect and low power consumption can be implemented.

(Second Embodiment)

First, the structure of a nitride-based semiconductor laser device according to a second embodiment of the present invention is described with reference to FIGS. 10 and 11. According to the second embodiment, an AlGaN low-temperature buffer layer 102 of about 15 nm in thickness, an undoped GaN layer 103 of about 3 μm in thickness, an n-type GaN contact layer 104 of about 5 μm in thickness, an n-type AlGaN cladding layer 105 of about 1 μm in thickness, an MQW active layer 106 of about 50 nm in thickness, a p-type AlGaN cladding layer 107 of about 300 nm in thickness and a p-type GaN contact layer 108 of about 70 nm in thickness are successively formed on a sapphire substrate 101, similarly to the first embodiment.

According to the second embodiment, a Pt electrode layer 121 is formed on the p-type GaN contact layer 108. A mixed layer 122 of Pt and Pd is formed on the Pt electrode layer 121. Further, a Pd-based electrode layer 123 having a three-layer structure formed by stacking a Pd layer of about 17 nm in thickness, an Au layer of about 100 nm in thickness and an Ni layer of about 200 nm in thickness in ascending order is formed on the mixed layer 122. The Pt electrode layer 121, the mixed layer 122 and the Pd-based electrode layer 123 form a p-side electrode.

An SiO₂ film 111 is formed to cover regions excluding the upper surface of the Pd-based electrode layer 123 and part of the exposed upper surface of the n-type GaN contact layer 104. A pad electrode 112 is formed to be in contact with the upper surface of the Pd-based electrode layer 123. An n-side electrode 113 is formed on the exposed upper surface of the n-type GaN contact layer 104. A pad electrode 114 is formed on the n-side electrode 113.

According to the second embodiment, the p-side electrode is formed by the Pt electrode layer 121 having strong adhesive force to the p-type GaN contact layer 108, the mixed layer 122 of Pt and Pd and the Pd-based electrode layer 123 including the Pd layer having low contact resistance, whereby the adhesive force of the overall p-side electrode to the p-type GaN contact layer 108 can be increased due to the Pt electrode layer 121 and the mixed layer 122 while low contact resistance can be attained due to the Pd-based electrode layer 123 and the mixed layer 122.

Figure 10:
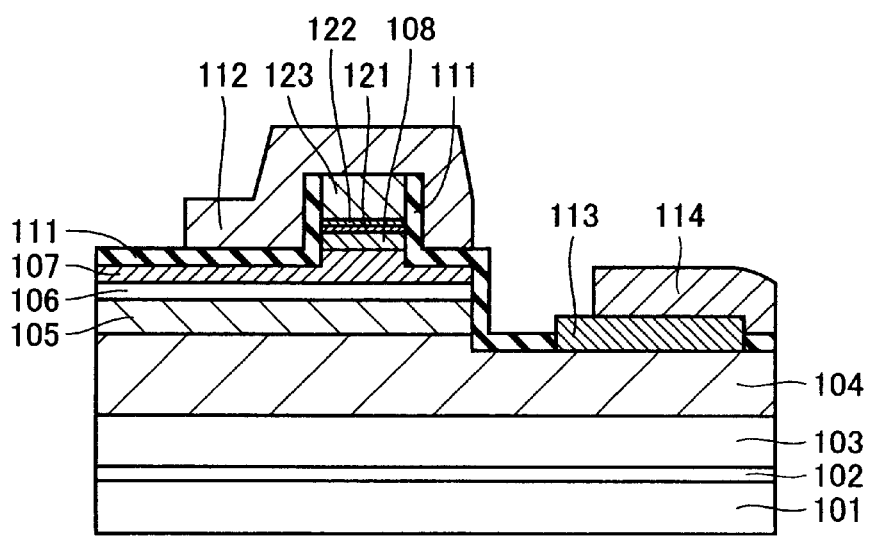
FIG. 10 is a sectional view showing a nitride-based semiconductor laser device according to a second embodiment of the present invention.
Figure 11:
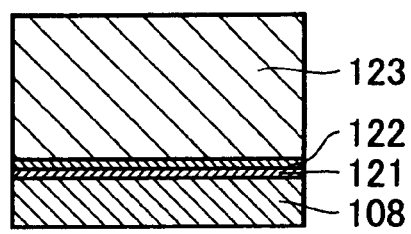
FIG. 11 is an enlarged sectional view of a portion around a p-side electrode of the nitride-based semiconductor laser device according to the second embodiment shown in FIG. 10.

FIGS. 12 to 18 are sectional views for illustrating a process of fabricating the nitride-based semiconductor laser device according to the second embodiment shown in FIG. 10. The fabrication process for the nitride-based semiconductor laser device according to the second embodiment is now described with reference to FIGS. 10 to 18.

Figure 12:
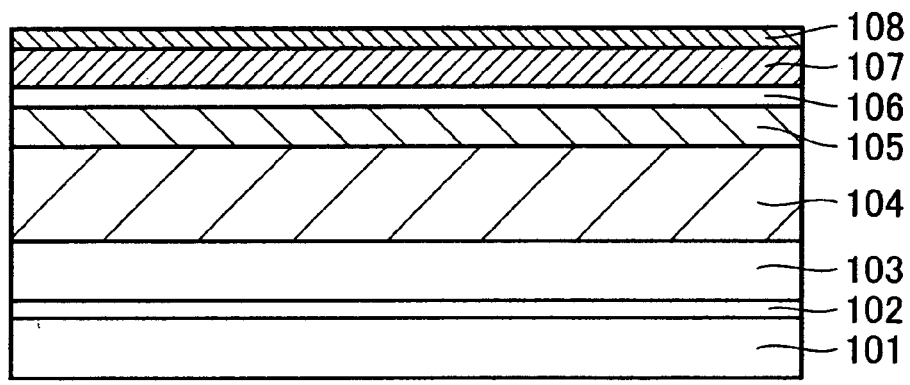
FIGS. 12 to 18 are sectional views for illustrating a process of fabricating the nitride-based semiconductor laser device according to the second embodiment shown in FIG. 10.

First, the AlGaN low-temperature buffer layer 102 of about 15 nm in thickness is grown on the sapphire substrate 101 by MOCVD under a low-temperature condition of about 600° C. in order to relax lattice mismatching, as shown in FIG. 12. Thereafter the undoped GaN layer 103 is formed on the AlGaN low-temperature buffer layer 102 by MOCVD in the thickness of about 3 μm. The n-type GaN contact layer 104 of about 5 μm in thickness, the n-type AlGaN cladding layer 105 of about 1 μm in thickness, the MQW active layer 106 of about 50 nm in thickness, the p-type AlGaN cladding layer 107 of about 300 nm in thickness and the p-type GaN contact layer 108 of about 70 nm in thickness are successively formed on the undoped GaN layer 103 by MOCVD.

Figure 13:
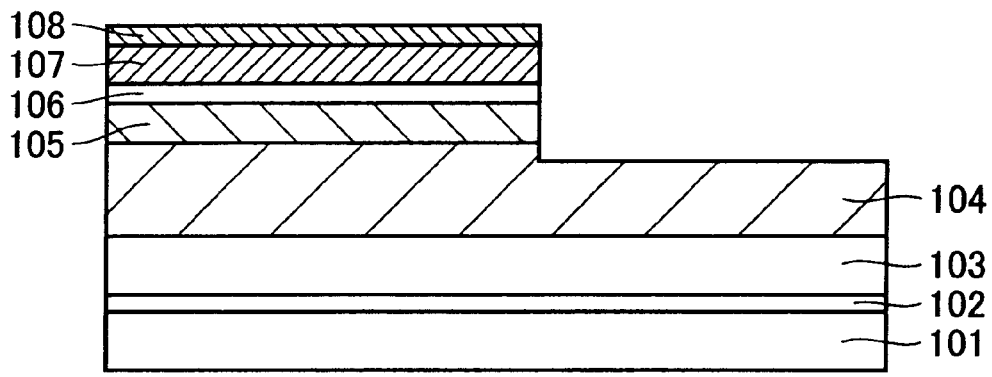

The layers from the P-type GaN contact layer 108 to the n-type GaN contact layer 104 are partially subjected to anisotropic dry etching, thereby exposing a partial region of the n-type GaN contact layer 104 as shown in FIG. 13.

Figure 14:
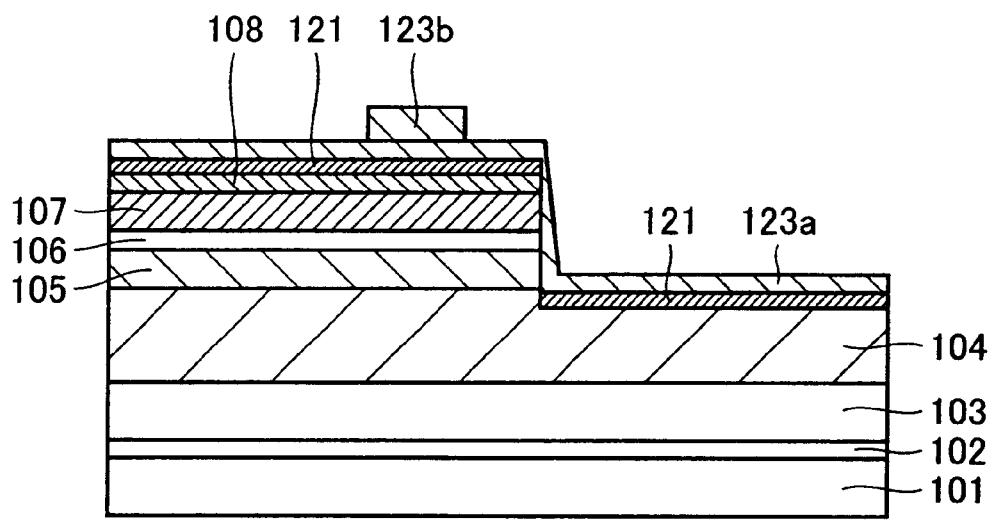

Then, cleaning is performed by aqua regia boiling, and the Pt electrode 121 of about 3 nm in thickness and a Pd layer 123a of about 10 nm are successively formed by EB evaporation, as shown in FIG. 14. At this time, the substrate temperature in evaporation is increased to about 150° C., in order to uniformalize the thickness of the Pt electrode layer 121. Thereafter a multilayer film 123b having a three-layer structure formed by stacking a Pd layer of about 10 nm in thickness, an Au layer of about 100 nm in thickness and an Ni layer of about 200 nm in thickness in ascending order is formed on a region corresponding to that formed with a ridge portion located on the Pd layer 123a in a striped shape of about 2 μm in width by the lift off method.

Figure 15:
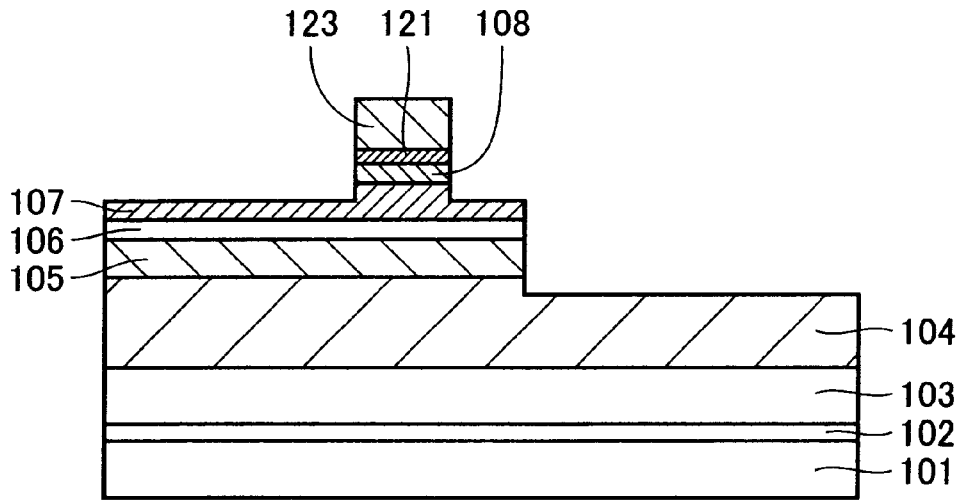

The uppermost Ni layer of the multilayer film 123b is employed as an etching mask for etching the Pd layer 123a, the Pt electrode layer 121 and the p-type GaN contact layer 108 by anisotropic dry etching employing $CF_4$ gas, and thereafter the p-type AlGaN cladding layer 107 is also etched by a thickness of about 150 nm. Thus, the ridge portion is formed as shown in FIG. 15, along with formation of the Pt electrode layer 121 and the Pd-based electrode layer 123 having the Pd layer of about 20 nm in thickness, the Au layer of about 100 nm in thickness and the Ni layer of about 200 nm in thickness successively stacked in ascending order.

Figure 16:
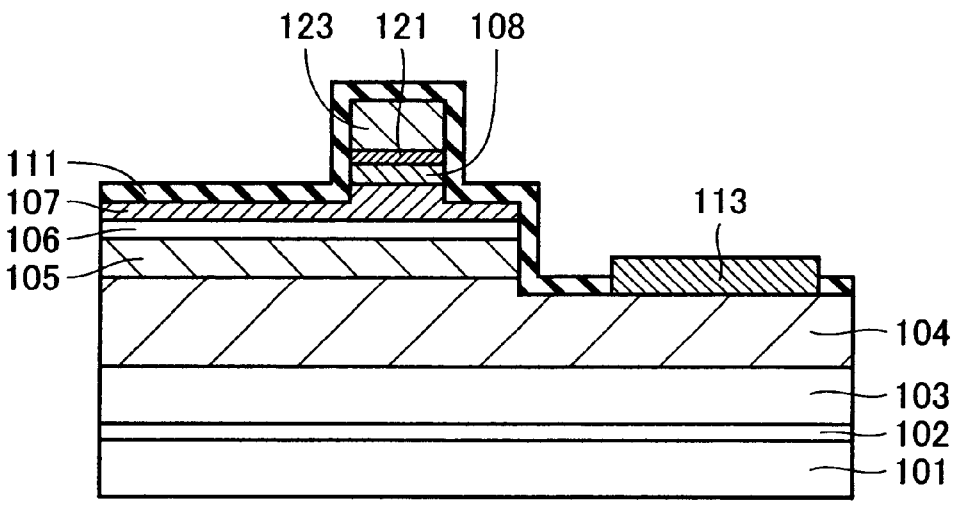

Then, the $SiO_2$ film 111 is deposited on the overall surface by plasma CVD and partially removed from part of the n-type GaN contact layer 104, as shown in FIG. 16. The n-side electrode 113 is formed on the part of the n-type GaN contact layer 104 from which the $SiO_2$ film 111 is removed.

Figure 17:
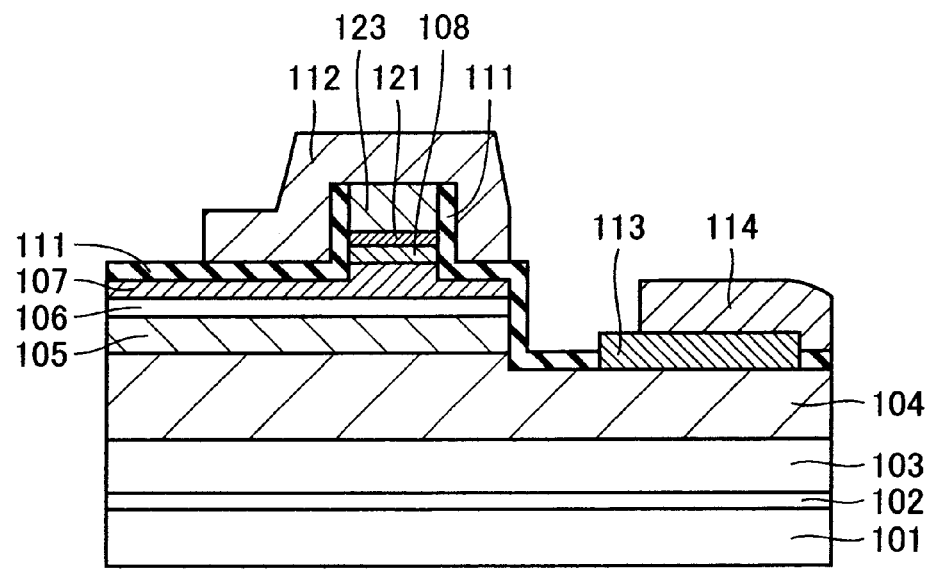

Then, the part of the $SiO_2$ film 111 located on the Pd-based electrode layer 123 is removed and thereafter the pad electrode 112 is formed to be in contact with the upper surface of the Pd-based electrode layer 123 while the pad electrode 114 is formed to be in contact with the upper surface of the n-side electrode 113, as shown in FIG. 17.

Figure 18:
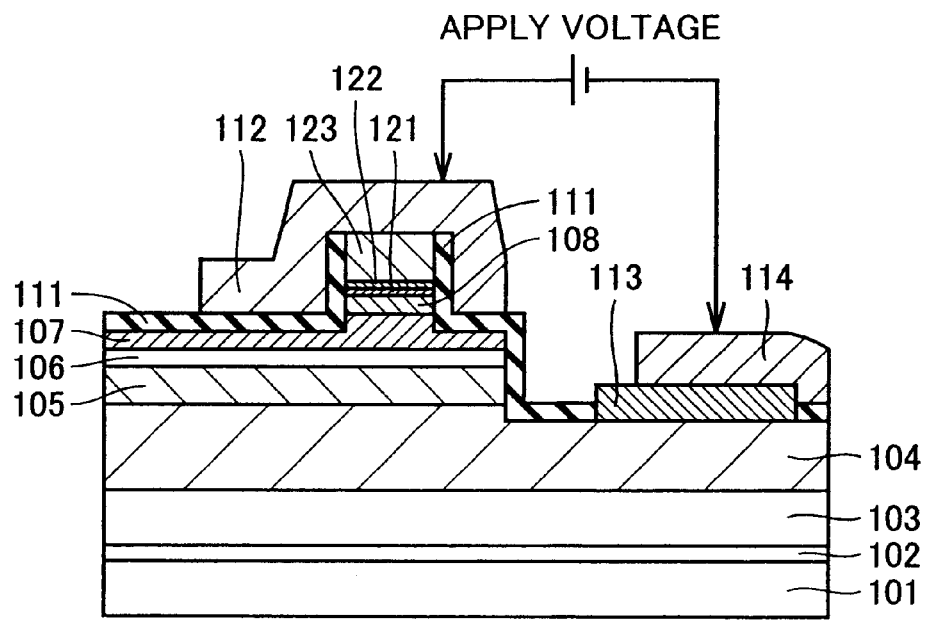

Then, a current of about 0.6 A is applied between the p-side pad electrode 112 and the n-side pad electrode 114 for about 5 seconds as shown in FIG. 18, thereby setting current density on the contact surface between the p-side electrode (the Pt electrode layer 121) and the p-type GaN contact layer 108 to 30 kA/cm² with a cavity length of 1 mm. In this case, the aforementioned current density of 30 kA/cm² is obtained as follows:

$$0.6 \text{ A}/(1 \text{ mm} \times 2 \text{ μm (width of ridge portion)}) = 30 \text{ kA/cm}^2 \quad (1)$$

The aforementioned current density of 30 kA/cm² must be larger than current density (about 5 kA/cm²) in operation and not more than 100 kA/cm², the maximum current density for the device without deterioration. In particular, current density in the range of 20 kA/cm² to 40 kA/cm² is effective. In consideration of this point, the current density is set to 30 kA/cm² in this embodiment. When the aforementioned current is applied, Pd contained in the Pd layer moves toward the Pt side due to a migration effect between the Pt electrode layer 121 and the Pd layer forming the Pd-based electrode layer 123. Thus, the mixed layer 122 consisting of Pt and Pd is formed between the Pd-based electrode layer 123 and the Pt electrode layer 121.

According to the second embodiment, the current is applied between the p-side electrode and the n-side electrode 113 as hereinabove described for moving Pd contained in the Pd-based electrode layer 123 toward a portion close to the surface of the p-type GaN contact layer 108. The mixing layer 122 is formed in this manner, whereby the low-contact property of Pd can be reliably provoked without reducing the adhesive force facilitated by the Pt electrode layer 121.

(Third Embodiment)

Figure 19:
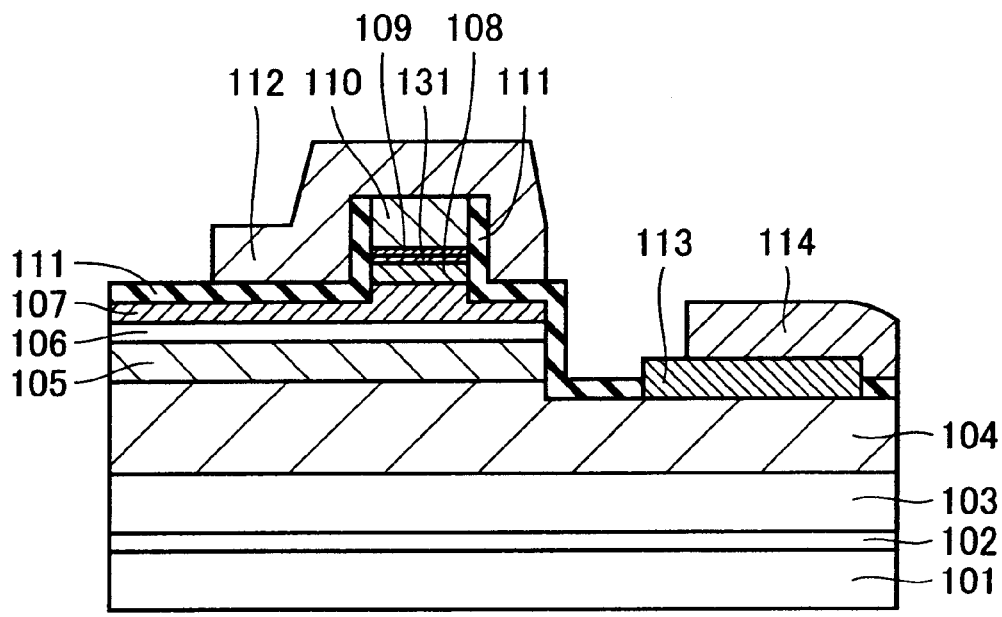
FIG. 19 is a sectional view showing a nitride-based semiconductor laser device according to a third embodiment of the present invention.
Figure 20:
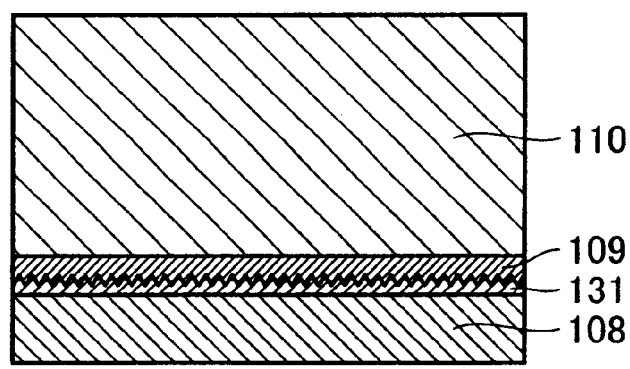
FIG. 20 is an enlarged sectional view of a portion around a p-side electrode of the nitride-based semiconductor laser device according to the third embodiment shown in FIG. 19.
Figure 21:
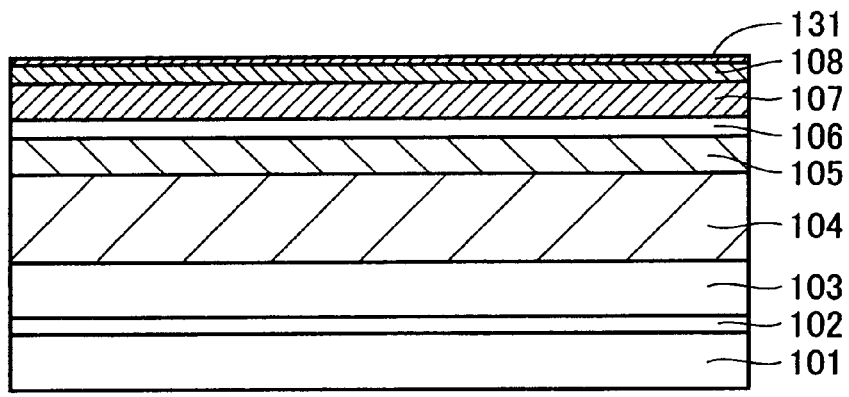
FIGS. 21 to 25 are sectional views for illustrating a process of fabricating the nitride-based semiconductor laser device according to the third embodiment shown in FIG. 19.

Referring to FIGS. 19 and 20, a nitride-based semiconductor laser device according to a third embodiment of the present invention is formed by providing a p-type InGaN contact layer 131 between a p-type GaN contact layer 108 and a Pt electrode layer 109 in a structure similar to that of the first embodiment shown in FIG. 1. The remaining structure of the third embodiment is similar to that of the first embodiment. The nitride-based semiconductor laser device according to the third embodiment is now described in detail.

In the nitride-based semiconductor laser device according to the third embodiment, an AlGaN low-temperature buffer layer 102 of about 15 nm in thickness, an undoped GaN layer 103 of about 3 μm in thickness, an n-type GaN contact layer 104 of about 5 μm in thickness, an n-type AlGaN cladding layer 105 of about 1 μm in thickness, an MQW active layer 106 of about 50 nm in thickness, a p-type AlGaN cladding layer 107 of about 300 nm in thickness and the p-type GaN contact layer 108 of about 70 nm in thickness are successively formed on a sapphire substrate 101, similarly to the first embodiment.

According to the third embodiment, the p-type InGaN contact layer 131 of about 3 nm in thickness is formed on the p-type GaN contact layer 108 forming a ridge portion. The In composition of the p-type InGaN contact layer 131 is 15%. As shown in FIG. 20, the p-type InGaN contact layer 131 having a small thickness and a high In composition exhibits an irregular surface. The Pt electrode layer 109 of about 1 nm in thickness is formed on this p-type InGaN contact layer 131. A Pd-based electrode layer 110 consisting of a multilayer film of a Pd layer of about 17 nm in thickness, an Au layer of about 100 nm in thickness and an Ni layer of about 200 nm in thickness stacked in ascending order is formed on the Pt electrode layer 109. The Pt electrode layer 109 and the Pd-based electrode layer 110 form a p-side electrode.

An $SiO_2$ film 111 is formed to cover regions excluding the upper surface of the Pd-based electrode layer 110 and part of the upper surface of the n-type GaN contact layer 104. A pad electrode 112 is formed to be in contact with the Pd-based electrode layer 110. An n-side electrode 113 is formed to be in contact with the exposed surface of the n-type GaN contact layer 104. A pad electrode 114 is formed to be in contact with the upper surface of the n-side electrode 113.

According to the third embodiment, the p-type InGaN contact layer 131 having the small thickness of about 3 nm and the high In composition of 15% is formed on the p-type GaN contact layer 108 as described above, whereby the degree of the irregularity on the surface of the p-type InGaN contact layer 131 can be increased. Thus, the contact area between the p-type InGaN contact layer 131 and the Pt electrode layer 109 can be increased. Consequently, contact resistance can be reduced and adhesive force between the Pt electrode layer 109 and the p-type InGaN contact layer 131 can be further improved.

Also in the third embodiment, the nitride-based semiconductor laser device is provided with the Pt electrode layer 109 having strong adhesive force while the Pd-based electrode layer 110 including the Pd layer having low contact resistance (interfacial energy barrier) is provided on the Pt electrode layer 109, whereby the adhesive force of the overall p-side electrode can be increased due to the Pt electrode layer 109 and a low contact resistance value can be attained due to the Pd layer included in the Pd-based electrode layer 110, similarly to the first embodiment. In particular, the adhesive force of the overall p-side electrode to the p-type InGaN contact layer 131 can be improved due to the Pt electrode layer 109 formed in the small thickness of about 1 nm without deteriorating the low contact property of the Pd layer. Consequently, the operating voltage can be reduced and reliability of the device can be improved.

A process of fabricating the nitride-based semiconductor laser device according to the third embodiment is now described with reference to FIGS. 19 to 25.

First, the AlGaN low-temperature buffer layer 102 of about 15 nm in thickness is formed on the sapphire substrate 101 by MOCVD under a low-temperature condition of about 600° C., in order to relax lattice mismatching. The undoped GaN layer 103 of about 3 μm in thickness is formed on the AlGaN low-temperature buffer layer 102 by MOCVD. Thereafter the n-type GaN contact layer 104 of about 5 μm in thickness, the n-type AlGaN cladding layer 105 of about 1 μm in thickness, the MQW active layer 106 of about 50 nm in thickness, the p-type AlGaN cladding layer 107 of about 300 nm in thickness and the p-type GaN contact layer 108 of about 70 nm in thickness are successively formed on the undoped GaN layer 103 by MOCVD. Further, the p-type InGaN contact layer 131 of about 3 nm in thickness having the In composition of 15% is formed on the p-type GaN contact layer 108 by MOCVD.

Figure 22:
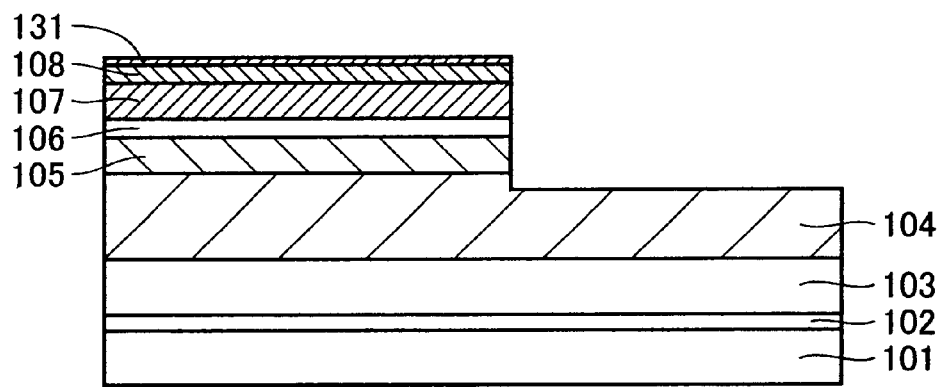

Then, the layers from the p-type InGaN contact layer 131 to the n-type GaN contact layer 104 are partially removed by anisotropic dry etching thereby exposing a partial region of the n-type GaN contact layer 104, as shown in FIG. 22.

Figure 23:
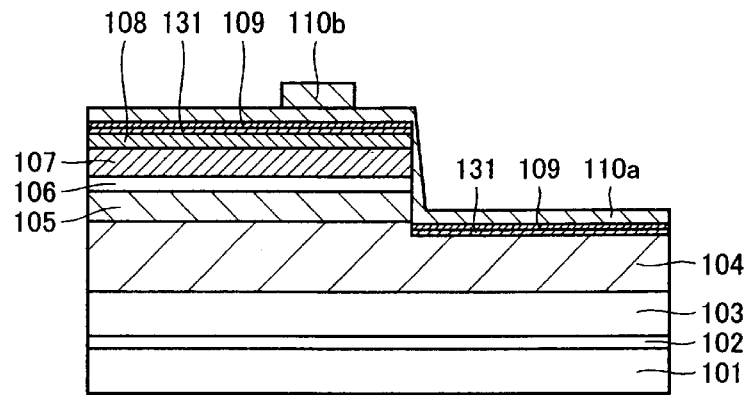
Figure 24:
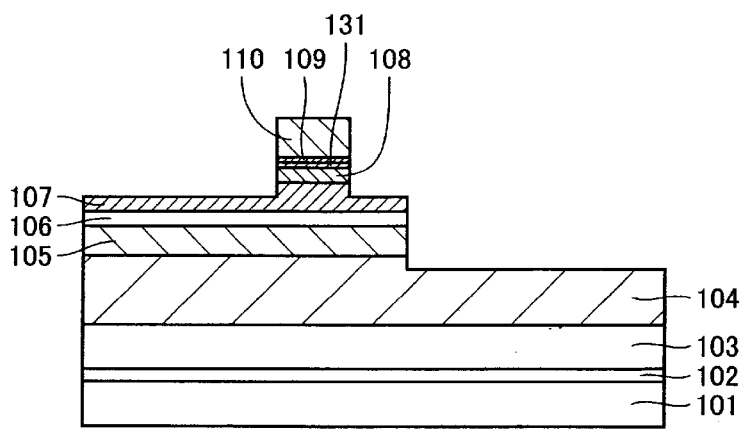

Then, cleaning is performed by aqua regia boiling, and the Pt electrode layer 109 is formed in the thickness of about 1 nm by EB evaporation while a Pd layer 110a is formed on the Pt electrode layer 109 in a thickness of about 7 nm, as shown in FIG. 23. At this time, the substrate temperature in evaporation is increased to about 150° C., in order to uniformalize the thickness of the Pt electrode layer 109. Thereafter a multilayer film 110b consisting of a Pd layer of about 10 nm in thickness, an Au layer of about 100 nm in thickness and an Ni layer of about 200 nm in thickness stacked in ascending order is formed on a region corresponding to that formed with a ridge portion located on the Pd layer 110a in a striped shape of about 2 μm in width by the lift off method. The uppermost Ni layer of the multilayer film 110b is employed as an etching mask for etching the Pd layer 110a, the Pt electrode layer 109, the p-type InGaN contact layer 131 and the p-type GaN contact layer 108 while etching the p-type AlGaN cladding layer 107 by a thickness of about 150 nm by anisotropic dry etching employing $CF_4$ gas. Thus, the ridge portion is formed as shown in FIG. 24, along with formation of the Pt electrode layer 109 and the Pd-based electrode layer 110 having the Pd layer of about 17 nm in thickness, the Au layer of about 100 nm in thickness and the Ni layer of about 200 nm in thickness successively stacked in ascending order.

Figure 25:
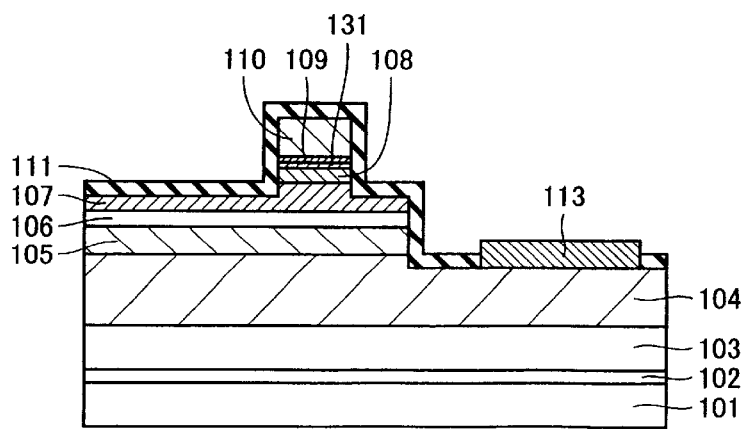

Then, the $SiO_2$ film 111 is deposited by plasma CVD and partially removed from part of the n-type GaN contact layer 104, as shown in FIG. 25. The n-side electrode 113 is formed on the part of the n-type GaN contact layer 104 from which the $SiO_2$ film 111 is removed.

Finally, the part of the $SiO_2$ film 111 located on the upper surface of the Pd-based electrode layer 110 is removed and thereafter the pad electrodes 112 and 114 are formed on the Pd-based electrode layer 110 and the n-side electrode 113 respectively, as shown in FIG. 19.

Thus, the nitride-based semiconductor laser device according to the third embodiment is formed.

(Fourth Embodiment)

The structure of a nitride-based semiconductor laser device according to a fourth embodiment of the present invention is now described with reference to FIG. 26. According to the fourth embodiment, an n-type contact layer 2, consisting of GaN, having a thickness of about 4 μm to about 6 μm is formed on a sapphire substrate 1. An n-type cladding layer 3, consisting of AlGaN, having a thickness of about 0.6 μm to about 1.2 μm and an MQW active layer 4 having a multiple quantum well (MQW) structure are formed on the n-type contact layer 2. The MQW active layer 4 is formed by alternately stacking three $In_xGa_{1-x}N$ quantum well layers of about 4 nm to about 8 nm in thickness and four $In_yGa_{1-y}N$ quantum barrier layers of about 8 nm to about 24 nm in thickness. Therefore, the MQW active layer 4 has a thickness of about 44 nm to about 120 nm (about 0.044 μm to about 0.12 μm), where X>Y, X=0.13 and Y=0.05 in the fourth embodiment.

A p-type cladding layer 5, consisting of AlGaN, having a projection is formed on the MQW active layer 4. The thickness of the projection of the p-type cladding layer 5 is about 0.3 μm to about 0.6 μm, and the thickness of the region other than the projection is about 0.1 μm.

A p-type contact layer 6, consisting of GaN, having a thickness of about 0.05 μm to about 0.15 μm is formed on the upper surface of the projection of the p-type cladding layer 5. The projection of the p-type cladding layer 5 and the p-type contact layer 6 form a ridge portion. A p-side electrode 10 consisting of a Pt layer having a thickness of about 0.3 nm to about 1 nm and a Pd layer having a thickness of about 3 nm to about 7 nm is formed on the upper surface of the ridge portion to be substantially in contact with the overall upper surface of the p-type contact layer 6.

In this case, the adhesive force of the p-side electrode 10 to the p-type contact layer 6 consisting of GaN can be increased due to the Pt layer, and low contact resistance can be attained due to the Pd layer.

Partial regions of the layers from the p-type cladding layer 5 to the n-type GaN contact layer 2 are removed. A current blocking layer 7, consisting of $SiO_2$, having a thickness of about 0.2 μm is formed to cover part of the exposed upper surface of the n-type GaN contact layer 2, the side surfaces of the n-type cladding layer 3, the MQW active layer 4 and the p-type cladding layer 5 and the upper surface of the p-type cladding layer 5 while exposing the upper surface of the p-side electrode 10.

According to the fourth embodiment, a p-side pad electrode 11, consisting of Au, having a large thickness of about 3 μm is formed on the current blocking layer 7, to be in contact with the p-side electrode 10. Thus, according to the fourth embodiment, the total thickness (about 3 μm) of the p-side electrode 10 and the p-side pad electrode 11 is larger than the distance (about 1.0 μm to about 2.1 μm) between the lower surface of the n-type cladding layer 3 located under the MQW active layer 4 and the upper surface of the ridge portion. According to the fourth embodiment, therefore, the distance between the upper surface of the p-side pad electrode 11 and the MQW active layer 4 is increased.

An n-side electrode 12 is formed on the exposed surface of the n-type GaN contact layer 2. An n-side pad electrode 13 is formed on the n-side electrode 12.

In the nitride-based semiconductor laser device having the aforementioned structure, a current flows from the p-side pad electrode 11 to the MQW active layer 4, the n-type cladding layer 3, the n-type GaN contact layer 2, the n-side electrode 12 and the n-side pad electrode 13 through the p-side electrode 10 as well as the p-type GaN contact layer 6 and the p-type cladding layer 5 forming the ridge portion. Thus, a laser beam can be generated in the region of the MQW active layer 4 located under the ridge portion.

Figure 26:
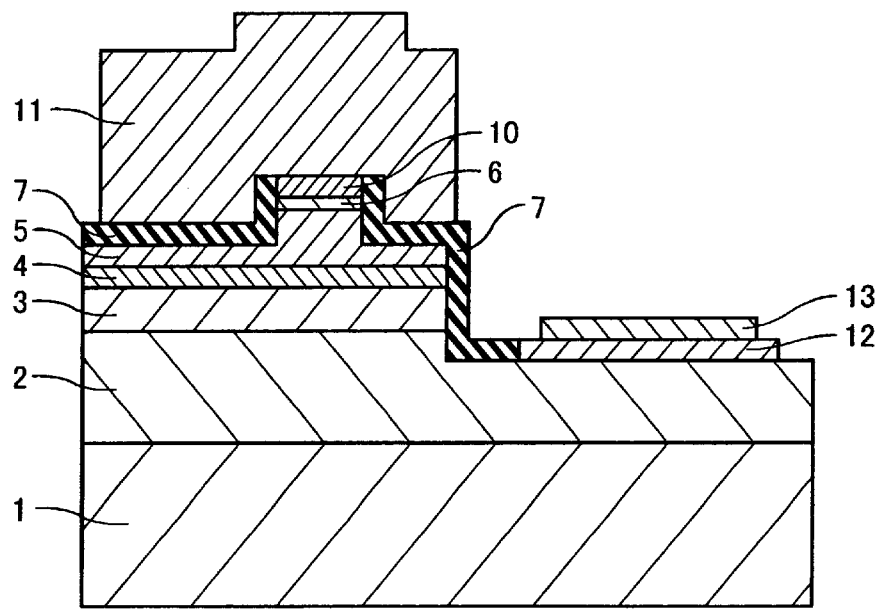
FIG. 26 is a sectional view showing a nitride-based semiconductor laser device according to a fourth embodiment of the present invention.
Figure 27:
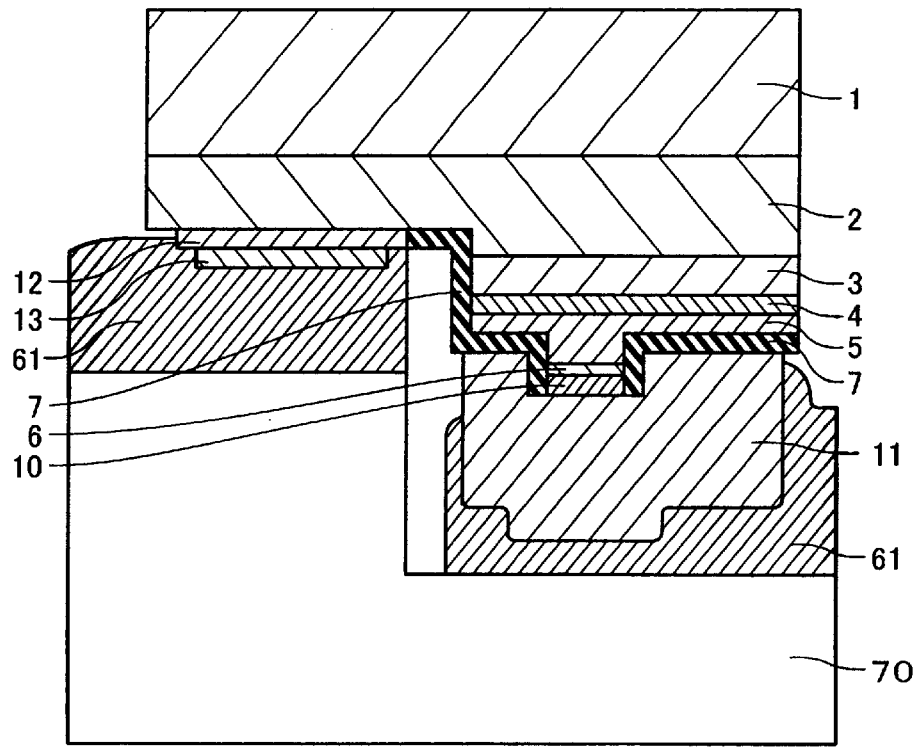
FIG. 27 is a sectional view showing the nitride-based semiconductor laser device according to the fourth embodiment shown in FIG. 26 in a state mounted on a submount in the junction-down system.

FIG. 27 shows the nitride-based semiconductor laser device having the structure shown in FIG. 26 in a state mounted on a submount 70 by the junction-down system so that the distance between the MQW active layer 4 and the submount 70 is smaller than that between the sapphire substrate 1 and the submount 70. Referring to FIG. 27, the nitride-based semiconductor laser device is mounted on the submount 70 by pressing and fusing the upper surface of the p-side pad electrode 11 against and to the submount 70 by a fusible material 61 such as solder with heat and a pressure. Thus, the nitride-based semiconductor laser device is fixed to the submount 70. Thereafter the submount 70 is fixed to a stem (not shown) for assembly.

According to the fourth embodiment, the p-side pad electrode 11 is formed in the large thickness of about 3 $\mu$m as described above, thereby increasing the distance between the MQW active layer 4 and the upper surface of the p-side pad electrode 11. Thus, the distance between the fusible material 61 and the MQW active layer 4 is increased so that the fusible material 61 can be prevented from covering the MQW active layer 4 when fixing the upper surface of the p-side pad electrode 11 to the submount 70 with the fusible material 61 by the junction-down system, as shown in FIG. 27. According to the fourth embodiment, further, the distance between the fusible material 61 and the MQW active layer 4 is so increased that the fusible material 61 can be prevented from reaching the front surface or the side surface of the n-type cladding layer 3 (p-n junction part) beyond the MQW active layer 4 in junction-down assembly. Consequently, the nitride-based semiconductor laser device can be prevented from shorting. Thus, the fourth embodiment can prevent deterioration of the emission characteristic and shorting, whereby the yield in junction-down assembly can be improved.

According to the fourth embodiment, as hereinabove described, the p-side pad electrode 11 is formed in the large thickness of about 3 $\mu$m for increasing the distance between the fusible material 61 and the MQW active layer 4, whereby the thickness of the fusible material 61 such as solder can be increased or the quantity of the fusible material 61 in the form of a pellet can be increased within the range not covering the MQW active layer 4. Thus, the nitride-based semiconductor laser device can be reliably fused to the submount 70 or the stem (not shown), to be effectively prevented from peeling off from the submount 70 or the stem. The yield of assembly can be improved also by this.

According to the fourth embodiment, the p-side pad electrode 11 is formed in the large thickness of about 3 $\mu$m as described above, whereby the distance between the ridge portion and the upper surface of the p-side pad electrode 11 is also increased. Thus, heat is hardly transmitted to the ridge portion in fusion with the fusible material 61, while the pressure transmitted to the ridge portion can be absorbed due to the large thickness of the p-side pad electrode 11 consisting of a relatively soft material (Au). Thus, the operating voltage of the nitride-based semiconductor laser device can be prevented from being increased due to the heat or the pressure in fusion, whereby increase of the heating value can be prevented. Consequently, the life of the nitride-based semiconductor laser device can be prevented from reduction.

According to the fourth embodiment, further, the p-side pad electrode 11 is formed in the large thickness as described above, whereby the heat generated in the MQW active layer 4 (emission part) can be also transversely radiated through the p-side pad electrode 11 through the ridge portion. Consequently, an excellent heat radiation characteristic can be attained.

(Fifth Embodiment)

Figure 28:
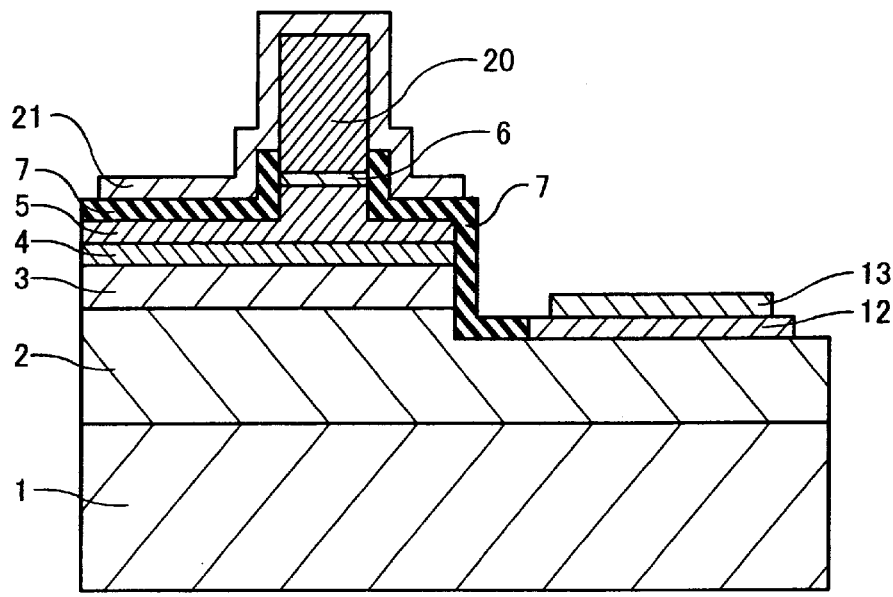
FIG. 28 is a sectional view showing a nitride-based semiconductor laser device according to a fifth embodiment of the present invention.

Referring to FIG. 28, a nitride-based semiconductor laser device according to a fifth embodiment of the present invention has a p-side electrode 20 formed in a large thickness, dissimilarly to the aforementioned fourth embodiment. According to the fifth embodiment, the thick p-side electrode 20 consisting of a Pt layer of about 0.5 nm in thickness, a Pd layer of about 5 nm in thickness and an Au layer of about 3 $\mu$m in thickness is formed on the upper surface of a ridge portion to be substantially in contact with the overall upper surface of a p-type contact layer 6.

In this case, the adhesive force of the p-side electrode 20 to the p-type contact layer 6 consisting of GaN can be increased due to the Pt layer while low contact resistance can be attained due to the Pd layer.

A p-side pad electrode 21 consisting of a Ti layer having a thickness of about 80 nm (about 0.08 $\mu$m) and an Au layer having a thickness of about 0.2 $\mu$m is formed to cover the p-side electrode 20.

The remaining structure of the nitride-based semiconductor laser device according to the fifth embodiment is substantially similar to that of the nitride-based semiconductor laser device according to the fourth embodiment shown in FIG. 26.

Figure 29:
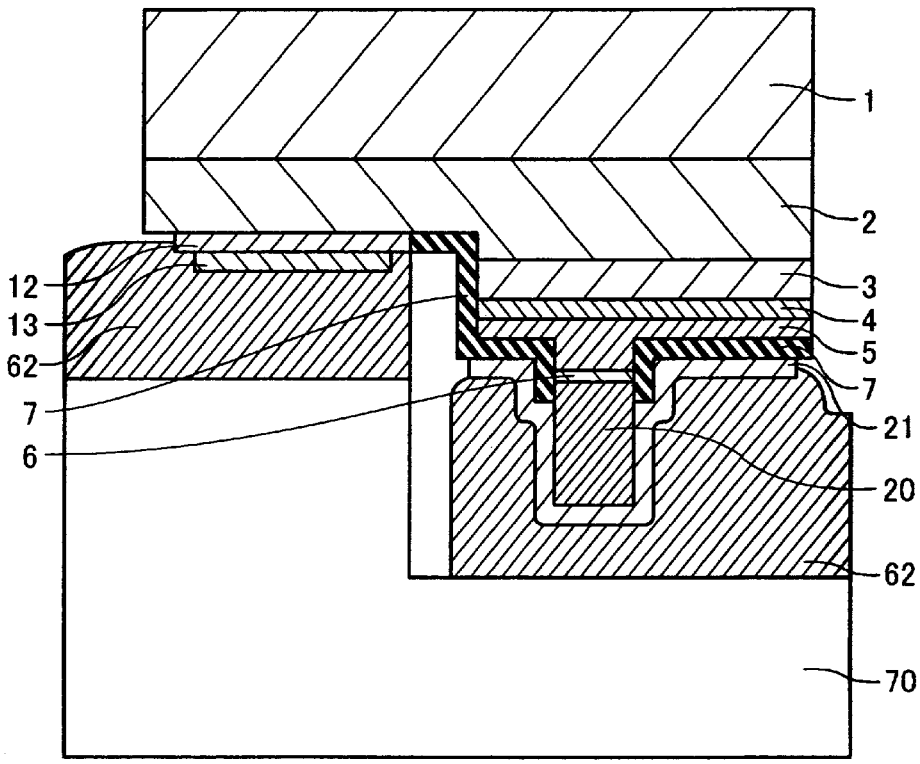
FIG. 29 is a sectional view showing the nitride-based semiconductor laser device according to the fifth embodiment shown in FIG. 28 in a state mounted on a submount in the junction-down system.

FIG. 29 shows the nitride-based semiconductor laser device according to the fifth embodiment having the structure shown in FIG. 28 in a state mounted on a submount 70 in the junction-down system. Referring to FIG. 29, the nitride-based semiconductor laser device according to the fifth embodiment is mounted by pressing and fusing the upper surface of the p-side pad electrode 21 against and to the submount 70 by a fusible material 62 such as solder with heat and a pressure.

According to the fifth embodiment, the p-side electrode 20 is formed in the large thickness to be substantially in contact with the overall upper surface of a ridge portion dissimilarly to the fourth embodiment, thereby increasing the step between a projection formed on the ridge portion and the remaining portion, as shown in FIG. 28. Thus, the ridge portion and the position of an emission point of an MQW active layer 4 located immediately under the same can be readily distinguished from the other portions in the transverse direction of the device. Consequently, the position of the emission point can be precisely controlled in assembly.

According to the fifth embodiment, further, the p-side electrode 20 is formed in the large thickness of about 3 $\mu$m as described above, thereby increasing the distance between the MQW active layer 4 and the upper surface of the p-side pad electrode 21, similarly to the fourth embodiment. Thus, the distance between the fusible material 62 and the MQW active layer 4 is so increased that the fusible material 62 can be prevented from covering the MQW active layer 4 as shown in FIG. 29, when fixing the upper surface of the p-side pad electrode 21 to the submount 70 in the junction-down system with the fusible material 62. Consequently, deterioration of the emission characteristic can be prevented. According to the fifth embodiment, further, the distance between the fusible material 62 and the MQW active layer 4 is so increased that the fusible material 62 can be prevented from reaching an n-type cladding layer 3 (p-n junction part) beyond the MQW active layer 4 in junction-down assembly, similarly to the fourth embodiment. Consequently, the nitride-based semiconductor laser device can be prevented from shorting. Thus, the fifth embodiment can prevent deterioration of the emission characteristic and shorting similarly to the fourth embodiment, whereby the yield in junction-down assembly can be improved.

According to the fifth embodiment, the p-side electrode 20 is formed in the large thickness of about 3 µm as described above thereby increasing the distance between the fusible material 62 and the MQW active layer 4 similarly to the fourth embodiment, whereby the thickness of the fusible material 62 such as solder can be increased or the quantity of the fusible material 62 in the form of a pellet can be increased in the range not covering the MQW active layer 4. Thus, the nitride-based semiconductor laser device can be reliably fused to the submount 70 or a stem (not shown), and effectively prevented from peeling off from the submount 70 or the stem. The yield of assembly can be improved also by this.

According to the fifth embodiment, the p-side electrode 20 is formed in the large thickness of about 3 µm as described above, thereby also increasing the distance between the ridge portion and the upper surface of the p-side pad electrode 21. Thus, heat is hardly transmitted to the ridge potion in fusion with the fusible material 62, while the pressure transmitted to the ridge portion can be absorbed due to the large thickness of the p-side electrode 20 containing a relatively soft material (Au). Therefore, the operating voltage of the nitride-based semiconductor laser device can be prevented from being increased due to the heat and the pressure in fusion similarly to the fourth embodiment, whereby increase of the heating value can be prevented. Consequently, the life of the nitride-based semiconductor laser device can be prevented from reduction.

(Sixth Embodiment)

Figure 30:
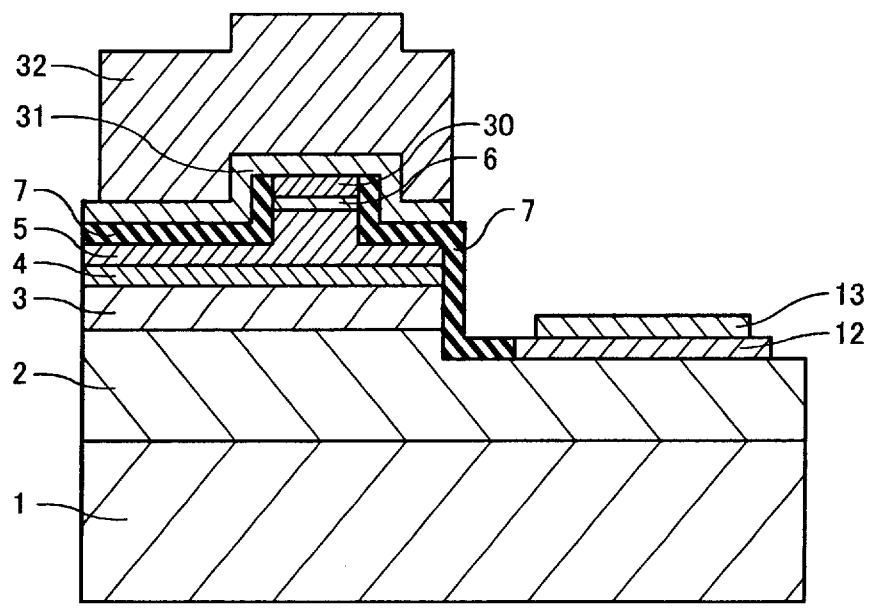
FIG. 30 is a sectional view showing a nitride-based semiconductor laser device according to a sixth embodiment of the present invention.

Referring to FIG. 30, a nitride-based semiconductor laser device according to a sixth embodiment of the present invention has a p-side thick-film electrode 32 having a large thickness formed on a p-side pad electrode 31 located on a p-side electrode 30. According to the sixth embodiment, the p-side electrode 30 consists of a multilayer film of a Pt layer having a thickness of about 0.3 nm to about 1.0 nm, a Pd layer having a thickness of about 3 nm to about 7 nm, an Au layer having a thickness of about 200 nm to about 300 nm and an Ni layer having a thickness of about 200 nm to about 300 nm.

In this case, the adhesive force of the p-side electrode 30 to a p-type contact layer 6 consisting of GaN can be increased due to the Pt layer, and low contact resistance can be attained due to the Pd layer.

The p-side pad electrode 31 consists of a multilayer film of a Ti layer having a thickness of about 5 nm to about 120 nm, a Pt layer having a thickness of about 80 nm to about 120 nm and an Au layer having a thickness of about 160 nm to about 240 nm. The p-side thick-film electrode 32 consists of a multilayer film of a Pd layer having a thickness of about 80 nm to about 120 nm, an Au layer having a thickness of about 2.5 µm to about 3.5 µm, a Pt layer having a thickness of about 120 nm to about 180 nm and an Au layer having a thickness of about 80 nm to about 120 nm.

The remaining structure of the nitride-based semiconductor laser device according to the sixth embodiment is substantially similar to that of the nitride-based semiconductor laser device according to the fourth embodiment shown in FIG. 26.

Figure 31:
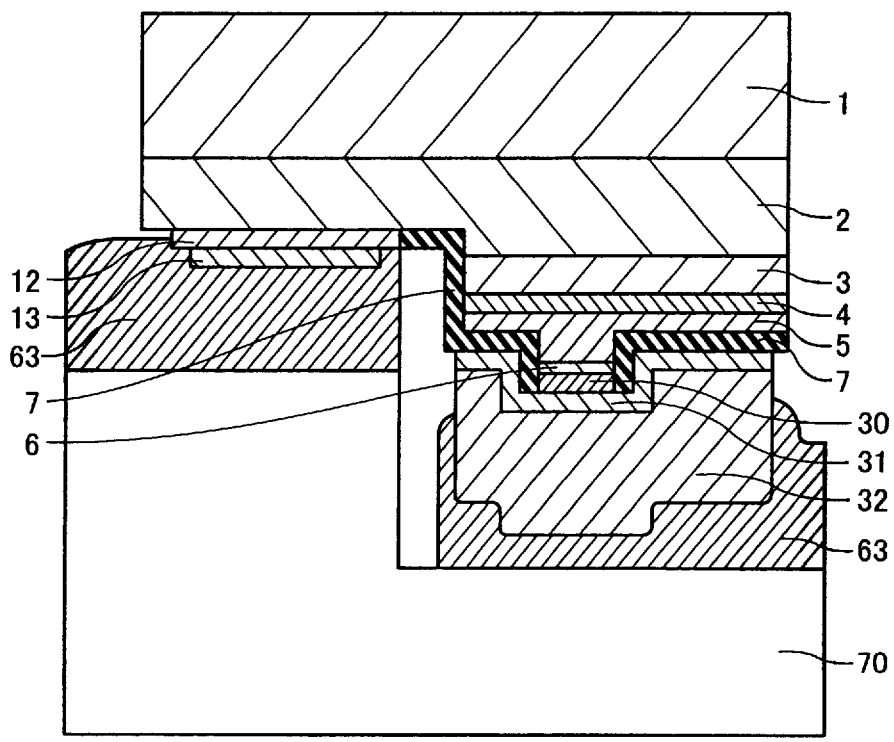
FIG. 31 is a sectional view showing the nitride-based semiconductor laser device according to the sixth embodiment shown in FIG. 30 in a state mounted on a submount in the junction-down system.

FIG. 31 shows the nitride-based semiconductor laser device according to the sixth embodiment having the structure shown in FIG. 30 in a state mounted on a submount 70 in the junction-down system. Referring to FIG. 31, the nitride-based semiconductor laser device is mounted by pressing and fusing the upper surface of the p-side thick-film electrode 32 against and to the submount 70 with a fusible material 63.

According to the sixth embodiment, the p-side thick-film electrode 32 having the large thickness of about 2.8 µm to about 3.9 µm is formed on the p-side pad electrode 31 as described above, thereby increasing the distance between an MQW active layer 4 and the upper surface of the p-side thick-film electrode 32. Thus, the distance between the fusible material 63 and the MQW active layer 4 is so increased that the fusible material 63 can be prevented from covering the MQW active layer 4 as shown in FIG. 31 when fixing the upper surface of the p-side thick-film electrode 32 to the submount 70 in the junction-down system with the fusible material 63. Consequently, deterioration of the emission characteristic can be prevented, similarly to the fourth and fifth embodiments. According to the sixth embodiment, further, the distance between the fusible material 63 and the MQW active layer 4 is so increased that the fusible material 63 can be prevented from reaching the front surface or the side surface of an n-type cladding layer 3 (p-n junction part) beyond the MQW active layer 4 in junction-down assembly, similarly to the fourth and fifth embodiments. Consequently, the nitride-based semiconductor laser device can be prevented from shorting. Thus, the sixth embodiment can prevent deterioration of the emission characteristic and shorting, whereby the yield in junction-down assembly can be improved.

According to the sixth embodiment, as hereinabove described, the p-side thick-film electrode 32 having a large thickness is formed on the p-side pad electrode 31 thereby increasing the distance between the fusible material 63 and the MQW active layer 4 similarly to the fourth and fifth embodiments, whereby the thickness of the fusible material 63 such as solder can be increased or the quantity of the fusible material 63 in the form of a pellet can be increased within the range not covering the MQW active layer 4. Thus, the nitride-based semiconductor laser device can be reliably fused to the submount 70 or the stem (not shown), to be effectively prevented from peeling off from the submount 70 or the stem. The yield of assembly can be improved also by this.

According to the sixth embodiment, the p-side thick-film electrode 32 having a large thickness is formed on the p-side pad electrode 31 as described above, whereby the distance between the ridge portion and the upper surface of the p-side thick-film electrode 32 is also increased. Thus, heat is hardly transmitted to the ridge portion in fusion with the fusible material 63, while the pressure transmitted to the ridge portion can be absorbed due to the large thickness of the p-side thick-film electrode 32 containing a relatively soft material (Au). Thus, the operating voltage of the nitride-based semiconductor laser device can be prevented from being increased due to the heat or the pressure in fusion similarly to the fourth and fifth embodiments, whereby increase of the heating value can be prevented. Consequently, the life of the nitride-based semiconductor laser device can be prevented from reduction.

Results of an experiment comparing change of the operating voltage are now described with reference to Tables 1 and 2 as to a case of forming no p-side thick-film electrode 32 on the p-side pad electrode 31 and the case of forming the p-side thick-film electrode 32 on the p-side pad electrode 31.

TABLE 1

| | Vf@100 mA (V) | | |
| --- | --- | --- | --- |
| | BEFORE ASSEMBLY | AFTER ASSEMBLY | ΔVf |
| MINIMUM | 7 | 8 | 1 |
| MAXIMUM | 7.2 | 10.2 | 3 |
| AVERAGE | 7.1 | 9.2 | 2.1 |

TABLE 2

| | Vf@100 mA (V) | | |
| --- | --- | --- | --- |
| | BEFORE ASSEMBLY | AFTER ASSEMBLY | ΔVf |
| MINIMUM | 7.3 | 8 | 0 |
| MAXIMUM | 8 | 8.2 | 0.7 |
| AVERAGE | 7.7 | 8.1 | 0.4 |

In this experiment, the thicknesses of the Pt layer, the Pd layer, the Au layer and the Ni layer forming the p-side electrode 30 were set to about 0.7 nm, about 5 nm, about 240 nm and about 240 nm respectively. The thicknesses of the Ti layer, the Pt layer and the Au layer forming the p-side pad electrode 31 were set to about 100 nm, about 100 nm and about 200 nm respectively. The thicknesses of the Pd layer, the Au layer, the Pt layer and the Au layer forming the p-side thick-film electrode 32 were set to about 100 nm, about 3 μm, about 150 nm and about 100 nm respectively. Referring to Tables 1 and 2, VF@100 mA (V) denotes a forward voltage at a constant current (100 mA). Symbol ΔVf denotes increase of the voltage observed after assembly. Table 1 shows the results in the case of forming no p-side thick-film electrode 32 on the p-side pad electrode 31, and Table 2 shows the results in the case of forming the p-side thick-film electrode 32 on the p-side pad electrode 31.

In the case of forming no p-side thick-film electrode 32 on the p-side pad electrode 31, the increase ΔVf of the operating voltage observed after junction-down assembly was 2.1 (V). In the case of forming the p-side thick-film electrode 32 on the p-side pad electrode 31 in the nitride-based semiconductor laser device according to the sixth embodiment, on the other hand, the increase ΔVf of the operating voltage observed after junction-down assembly was 0.4 (V). Thus, it is understood from the experimental data that increase of the operating voltage is suppressed according to the sixth embodiment.

According to the sixth embodiment, the p-side thick-film electrode 32 having a large thickness is formed on the p-side pad electrode 31 as described above, whereby heat generated in the MQW active layer 4 (emission part) can be also transversely radiated through the p-side thick-film electrode 32 through the ridge portion. Consequently, an excellent heat radiation characteristic can be attained.

(Seventh Embodiment)

Figure 32:
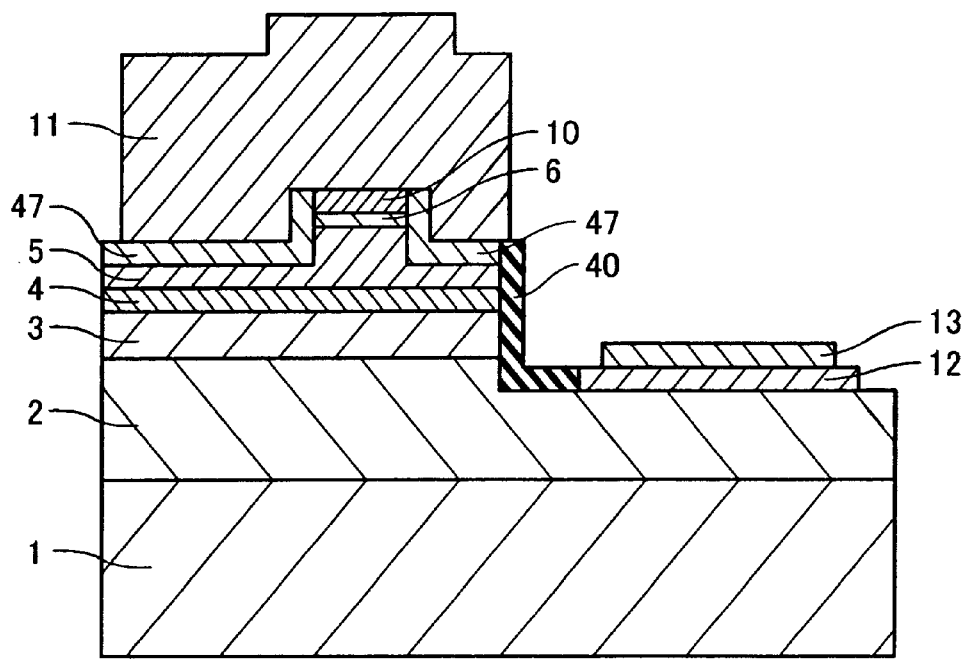
FIG. 32 is a sectional view showing a nitride-based semiconductor laser device according to a seventh embodiment of the present invention.

Referring to FIG. 32, a nitride-based semiconductor laser device according to a seventh embodiment of the present invention has a protective film 40 consisting of SiO$_2$ and an n-type current blocking layer 47 consisting of AlGaN formed in place of the current blocking layer 7 according to the fourth embodiment shown in FIG. 26. In the seventh embodiment, the protective film 40, consisting of SiO$_2$, having a thickness of about 0.2 μm to about 0.5 μm is formed to cover the side surfaces of an n-type GaN contact layer 2, an n-type cladding layer 3, an MQW active layer 4 and a p-type cladding layer 5 having partial regions exposed by removal. The n-type current blocking layer 47, consisting of AlGaN, having a thickness of about 0.1 μm to about 0.6 Mm is formed to cover the upper surface of the p-type cladding layer 5 and the side surface of a ridge portion while exposing the upper surface of a p-side electrode 10. The remaining structure of the nitride-based semiconductor laser device according to the seventh embodiment is substantially similar to that of the nitride-based semiconductor laser device according to the fourth aspect shown in FIG. 26.

The nitride-based semiconductor laser device according to the seventh embodiment having the structure shown in FIG. 32 is mounted on a submount in the junction-down system by pressing and fusing the upper surface of a p-side pad electrode 11 against and to the submount with a fusible material for fixing the same, similarly to the fourth embodiment.

According to the seventh embodiment, the protective film 40 consisting of SiO$_2$ and the n-type current blocking layer 47 consisting of AlGaN are formed in place of the current blocking layer 7 consisting of SiO$_2$ according to the fourth embodiment as described above, whereby an effect similar to that of the fourth embodiment can be attained.

(Eighth Embodiment)

Figure 33:
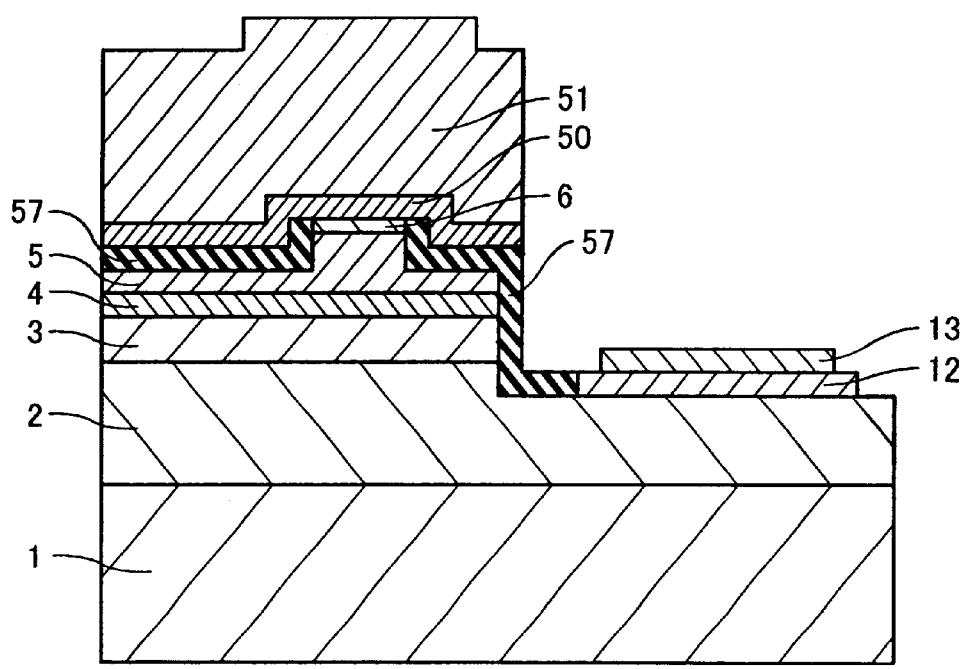
FIG. 33 is a sectional view showing a nitride-based semiconductor laser device according to an eighth embodiment of the present invention.

Referring to FIG. 33, a nitride-based semiconductor laser device according to an eighth embodiment of the present invention has a p-side electrode 50 formed not only on a ridge portion but also on a current blocking layer 57 and a p-side pad electrode 51 formed substantially on the overall upper surface of the p-side electrode 50 in a large thickness, dissimilarly to the aforementioned first to seventh embodiments.

According to the eighth embodiment, the current blocking layer 57 consisting of SiO$_2$ is formed to cover part of the upper surface of an n-type GaN contact layer 2 having a partial region exposed by removal, the side surfaces of an n-type cladding layer 3, an MQW active layer 4 and a p-type cladding layer 5 and the upper surface of the p-type cladding layer 5 while exposing only the upper surface of the ridge portion (the upper surface of a p-type GaN contact layer 6). A p-side electrode 50 consisting of a Pt layer having a thickness of about 0.3 nm to about 1 nm and a Pd layer having a thickness of about 3 nm to about 7 nm is formed on the current blocking layer 57 to substantially cover the overall upper surface of the current blocking layer 57 while coming into contact with the p-type contact layer 6 on the upper surface of the ridge portion. A p-side pad electrode 51, consisting of Au, having a large thickness of about 3 μm is formed to substantially cover the overall upper surface of the p-side electrode 50.

The remaining structure of the nitride-based semiconductor laser device according to the eighth embodiment is substantially similar to that of the nitride-based semiconductor laser device according to the fourth embodiment shown in FIG. 26.

The nitride-based semiconductor laser device having the structure shown in FIG. 33 is mounted on a submount in the junction-down system by pressing and fusing the upper surface of the p-side pad electrode 51 against and to the submount with a fusible material, similarly to the fourth embodiment.

According to the eighth embodiment, the p-side pad electrode 51 is formed to substantially cover the overall upper surface of the p-side electrode 50 formed not only on the ridge portion but also on the current blocking layer 57, whereby the contact area between the p-side electrode 50 and the p-side pad electrode 51 is increased as compared with the first to seventh embodiments. Thus, heat can be excellently radiated from the p-side electrode 50 to the p-side pad electrode 51. The p-side pad electrode 51 is formed in the large thickness of about 3 µm, whereby heat generated in the MQW active layer 4 (emission part) can be also transversely radiated through the p-side pad electrode 51. Consequently, an excellent radiation characteristic can be attained.

According to the eighth embodiment, the thick p-side pad electrode 51 is formed substantially on the overall upper surface of the p-side electrode 50 as described above, whereby an effect similar to that of the aforementioned fourth embodiment can be attained.

(Ninth Embodiment)

Figure 34:
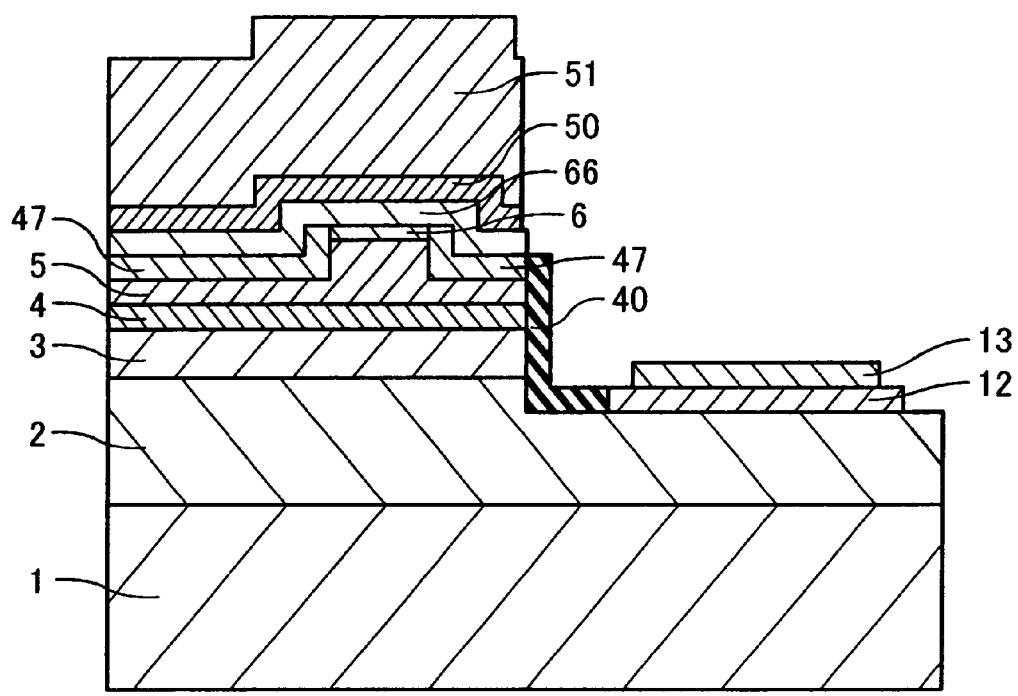
FIG. 34 is a sectional view showing a nitride-based semiconductor laser device according to a ninth embodiment of the present invention.
Figure 35:
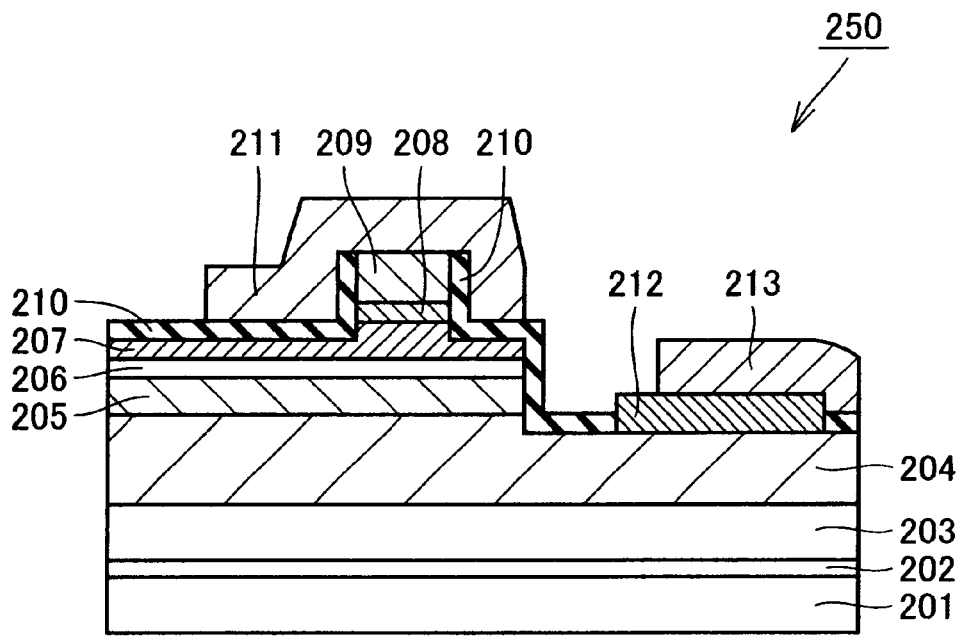
FIG. 35 is a sectional view showing a first conventional nitride-based semiconductor laser device.
Figure 36:
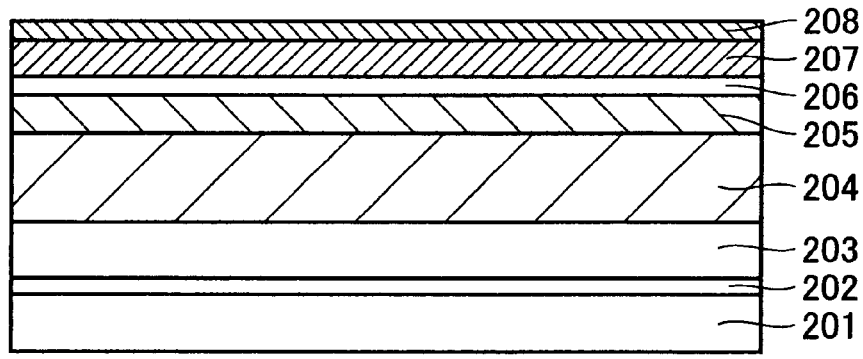
FIGS. 36 to 40 are sectional views for illustrating a process of fabricating the first conventional nitride-based semiconductor laser device shown in FIG. 35.
Figure 37:
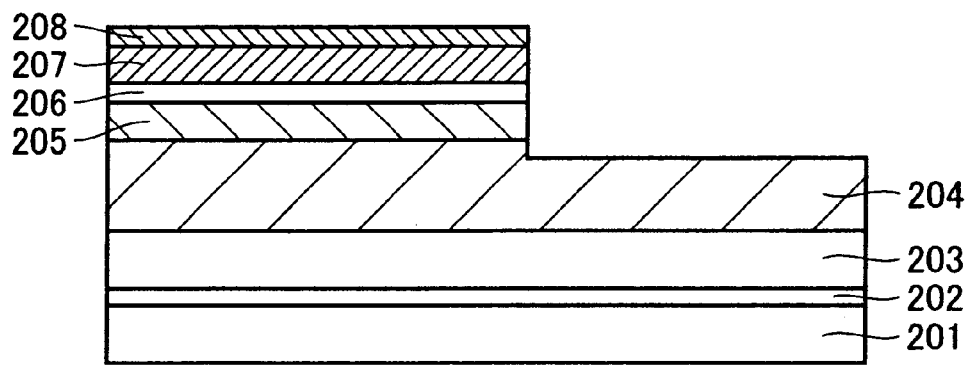
Figure 38:
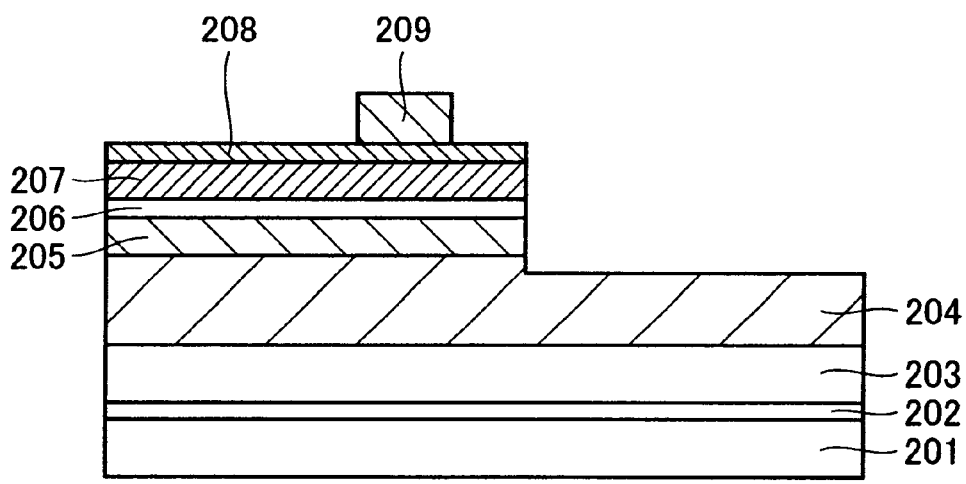
Figure 39:
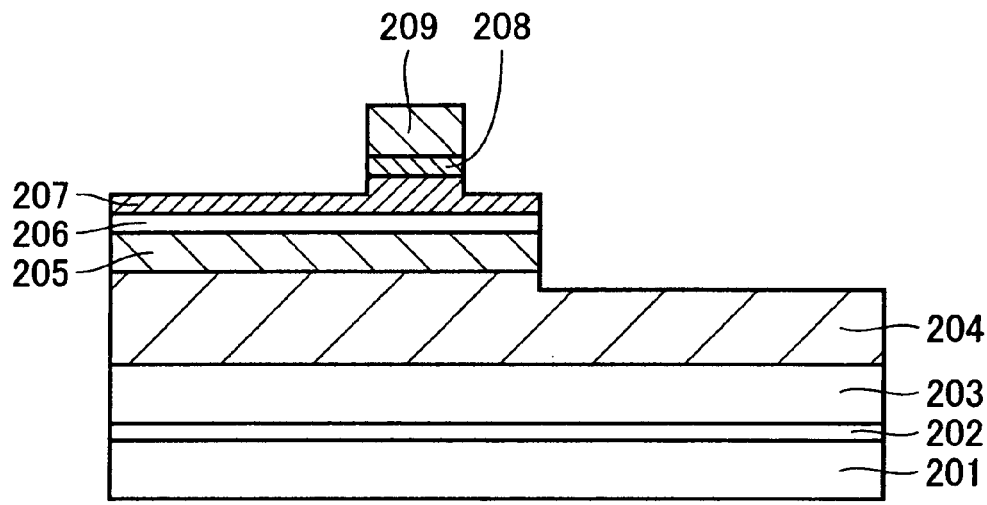
Figure 40:
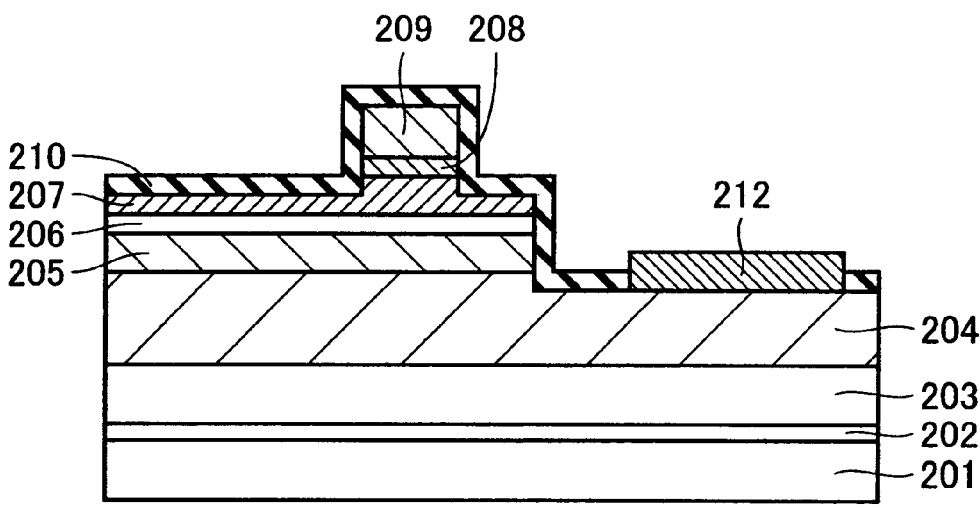
Figure 41:
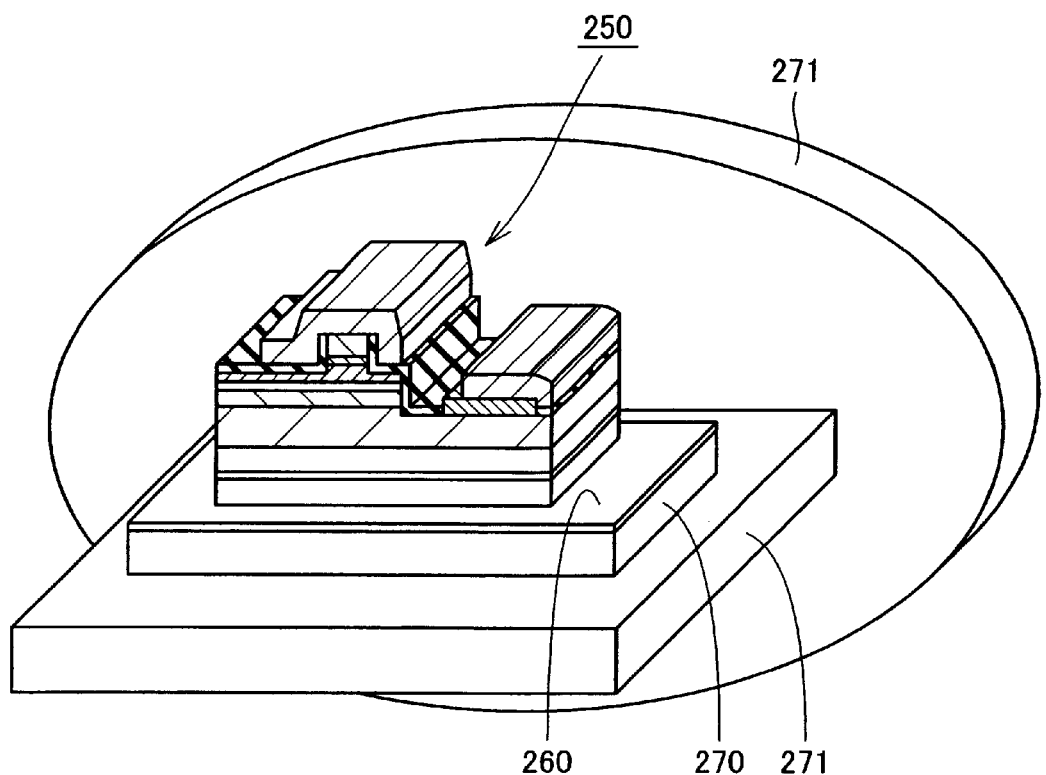
FIG. 41 is a perspective view showing the first conventional nitride-based semiconductor laser device shown in FIG. 35 in a state mounted on a submount in a junction-up system.
Figure 42:
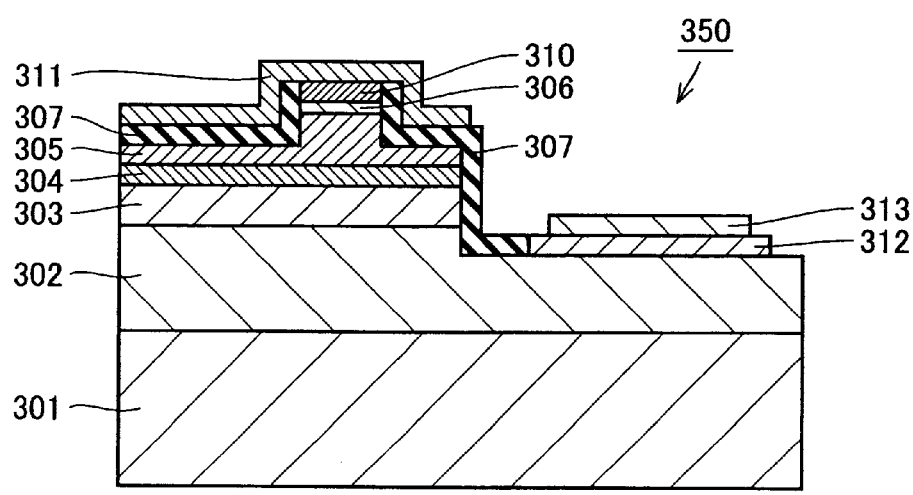
FIG. 42 is a sectional view showing a second conventional semiconductor laser device.
Figure 43:
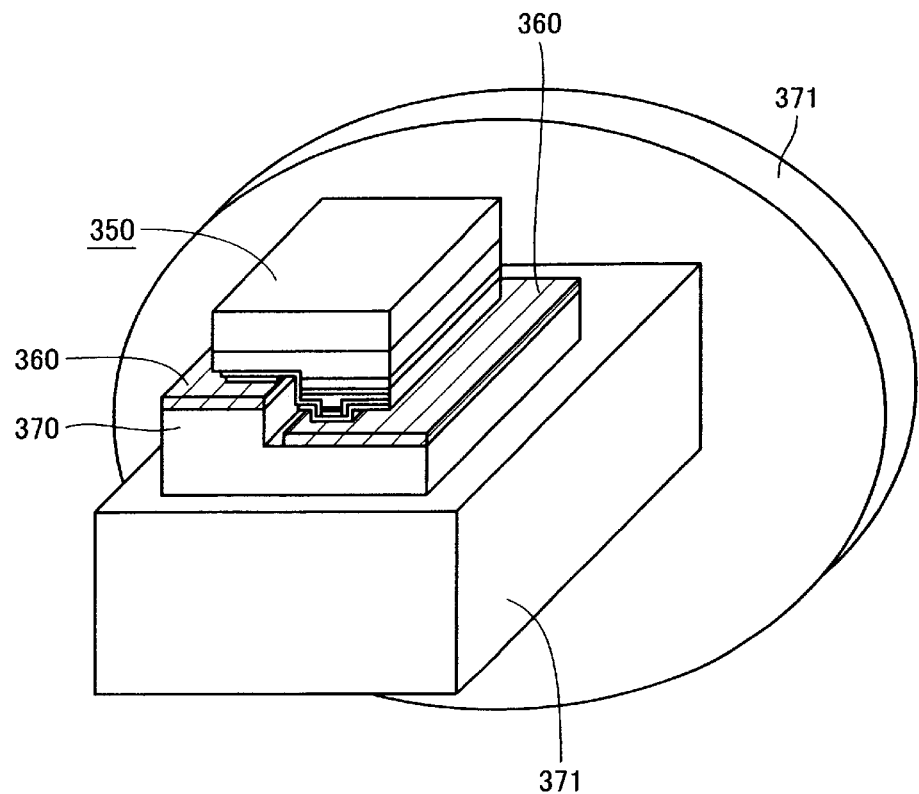
FIG. 43 is a perspective view showing the second conventional semiconductor laser device in a state mounted on a submount provided on a stem in the junction-down system.
Figure 44:
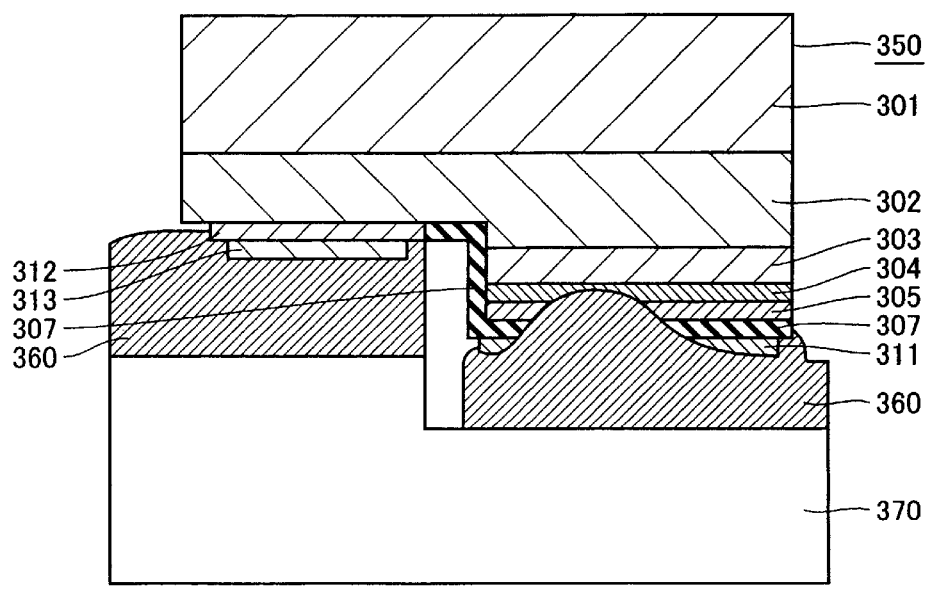
FIGS. 44 to 46 are sectional views showing the second conventional nitride-based semiconductor laser device in a state mounted on a submount in the junction-down system.
Figure 45:
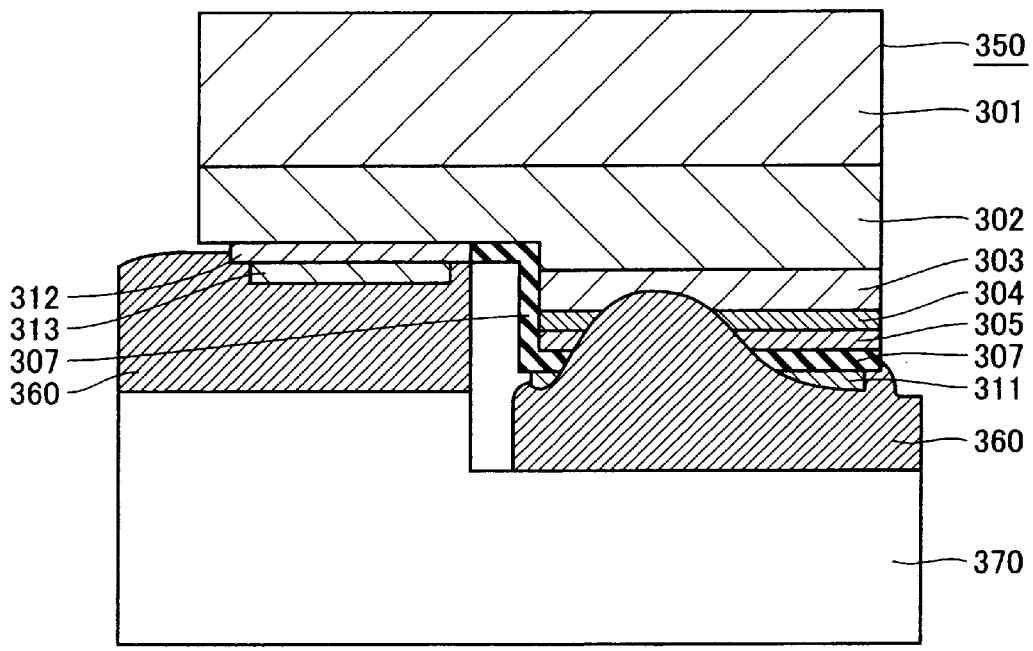
Figure 46:
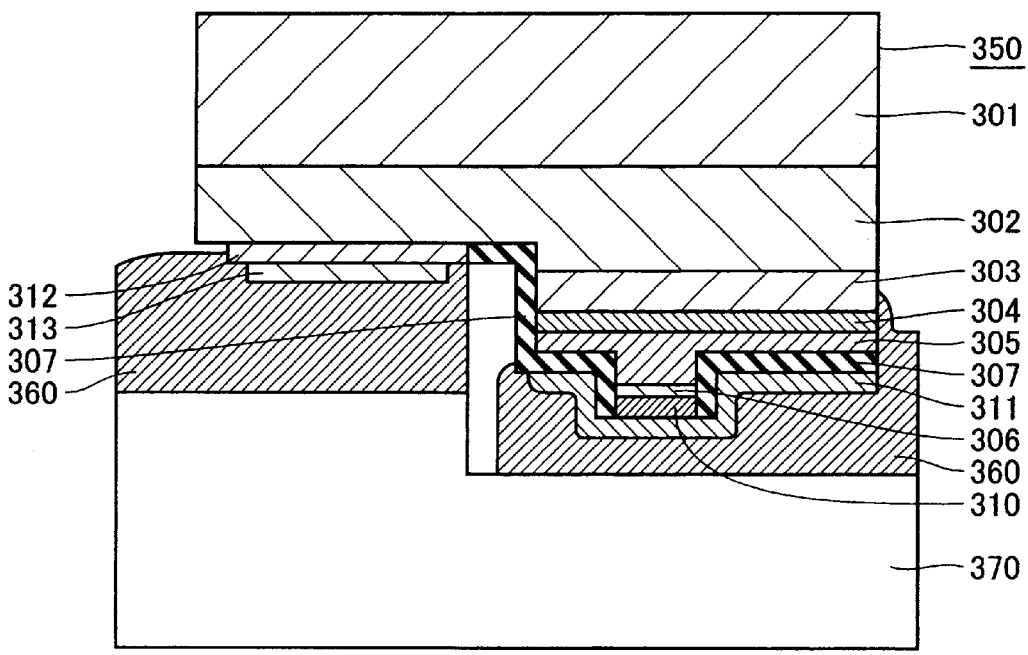

Referring to FIG. 34, a nitride-based semiconductor laser device according to a ninth embodiment of the present invention is prepared by forming a p-type GaN second contact layer 66 under a p-side electrode 50 similar to that of the eighth embodiment shown in FIG. 33. According to the ninth embodiment, a protective film 40 and an n-type current blocking layer 47 are formed in place of the current blocking layer 57 according to the eighth embodiment. The p-type GaN second contact layer 66 is an example of the "contact layer" according to the present invention.

According to the ninth embodiment, the protective film 40, consisting of SiO$_2$, having a thickness of about 0.2 µm to about 0.5 µm is formed to cover part of the upper surface of an n-type GaN contact layer 2 having a partial region exposed by removal and the side surfaces of an n-type cladding layer 3, an MQW active layer 4 and a p-type cladding layer 5. Further, the n-type current blocking layer 47, consisting of AlGaN, having a thickness of about 0.1 µm to about 0.6 µm is formed to cover the upper surface of the p-type cladding layer 5 while exposing only the upper surface of a p-type GaN contact layer 6. The p-type GaN second contact layer 66 is formed on the current blocking layer 47 to substantially cover the overall upper surface of the current blocking layer 47 while coming into contact with the p-type contact layer 6 on the upper surface of a ridge portion.

A p-side electrode 50 and a p-side pad electrode 51 having a large thickness are formed to substantially cover the overall upper surface of the p-type GaN second contact layer 66. The materials for and the thicknesses of the p-side electrode 50 and the p-side pad electrode 51 are identical to those in the eighth embodiment shown in FIG. 33. The remaining structure of the nitride-based semiconductor laser device according to the ninth embodiment is substantially similar to that of the nitride-based semiconductor laser device according to the eighth embodiment shown in FIG. 33.

The nitride-based semiconductor laser device according to the ninth embodiment having the structure shown in FIG. 34 is mounted on a submount in the junction-down system by pressing and fusing the upper surface of the p-side pad electrode 51 against and to the submount with a fusible material for fixing the same, similarly to the eighth embodiment.

According to the ninth embodiment, the p-type GaN second contact layer 66 is formed substantially on the overall upper surface of the current blocking layer 47 while the p-side electrode 50 and the p-side pad electrode 51 having a large thickness are formed to substantially cover the overall upper surface of the p-type GaN second contact layer 66 as described above, whereby an effect similar to that of the eighth embodiment can be attained.

Although the present invention has been described and illustrated in detail, it is clearly understood that the same is by way of illustration and example only and is not to be taken by way of limitation, the spirit and scope of the present invention being limited only by the terms of the appended claims.

While each of the aforementioned embodiments employs the Pt layer as the material having strong adhesive force to the nitride-based semiconductor layer (n-type GaN contact layer) and employs the Pd layer as the material having low contact resistance (interfacial energy barrier) with respect to the nitride-based semiconductor layer, for example, the present invention is not restricted to this but other materials may alternatively be employed. For example, an alloy layer obtained by heat-treating Ni/Au, Co/Au or Cu/Au may be employed.

While both of the p-side electrode and the n-side electrode are provided on the surface of the nitride-based semiconductor laser device in each of the aforementioned first to third embodiments, the present invention is not restricted to this but is also applicable to a structure having a p-side electrode provided on the surface of a nitride-based semiconductor laser device and an n-side electrode provided on the back surface.

While the nitride-based semiconductor laser device is assembled in the junction-down system in the aforementioned first embodiment, the present invention is not restricted to this but is also applicable to a nitride-based semiconductor laser device assembled in the junction-up system.

While the p-type InGaN layer 131 has the In composition of 15% and the thickness of 3 nm in the third embodiment, the present invention is not restricted to this but the surface of a p-type InGaN layer having an In composition of at least 3% and a thickness of not more than 20 nm can be irregularized for attaining an effect similar to the above.

While the protective film 40 is made of SiO$_2$ in each of the aforementioned seventh and ninth embodiments, the present invention is not restricted to this but a similar effect can be attained by employing an insulator film.

While the n-type current blocking layer 47 is made of AlGaN in each of the seventh and ninth embodiments, the present invention is not restricted to this but a similar effect can be attained by preparing the n-type current blocking layer 47 from a nitride-based semiconductor, other than AlGaN, such as InGaN or GaN.

What is claimed is:

1. A nitride-based semiconductor laser device comprising:
a nitride-based semiconductor layer formed on an active layer; and
an electrode layer formed on said nitride-based semiconductor layer, wherein
said electrode layer includes:
a first p-side electrode layer containing a material having strong adhesive force to said nitride-based semiconductor layer, and
a second p-side electrode layer, formed on said first p-side electrode layer, having weaker adhesive force to said nitride-based semiconductor layer than said first p-side electrode layer for reducing contact resistance of said electrode layer with respect to said nitride-based semiconductor layer wherein:
said first p-side electrode layer contains at least one material selected from a group consisting of Pt, Hf and Zr; and
said second p-side electrode layer contains Pd.

2. The nitride-based semiconductor laser device according to claim 1, wherein
said second electrode layer has lower contact resistance with respect to said nitride-based semiconductor layer than said first electrode layer.

3. A nitride-based semiconductor laser device comprising:
a nitride-based semiconductor layer formed on an active layer; and
an electrode layer formed on said nitride-based semiconductor layer, wherein
said electrode layer includes:
a first electrode layer containing a material having strong adhesive force to said nitride-based semiconductor layer, and
a second electrode layer, formed on said first electrode layer, having weaker adhesive force to said nitride-based semiconductor layer than said first electrode layer for reducing contact resistance of said electrode layer with respect to said nitride-based semiconductor layer, wherein
said first electrode layer has a thickness of not more than 3 nm.

4. The nitride-based semiconductor laser device according to claim 1, wherein
said first electrode layer includes a Pt layer, and
said second electrode layer includes a multilayer film having a Pd layer.

5. The nitride-based semiconductor laser device according to claim 4, wherein
the uppermost layer of said second electrode layer includes a metal layer serving as an etching mask.

6. The nitride-based semiconductor laser device according to claim 1, further comprising a mixed layer,
formed between said first and second electrode layers, including a Pt layer and a Pd layer.

7. A nitride-based semiconductor laser device comprising:
a nitride-based semiconductor layer formed on an active layer; and
an electrode layer formed on said nitride-based semiconductor layer, wherein
said electrode layer includes:
a first electrode layer containing a material having strong adhesive force to said nitride-based semiconductor layer, and
a second electrode layer, formed on said first electrode layer, having weaker adhesive force to said nitride-based semiconductor layer than said first electrode layer for reducing contact resistance of said electrode layer with respect to said nitride-based semiconductor layer, wherein
said nitride-based semiconductor layer includes a contract layer having an irregular surface.

8. The nitride-based semiconductor laser device according to claim 7, wherein
said nitride-based semiconductor layer having said irregular surface has an In composition of at least 3% and a thickness of not more than 20 nm.

9. The nitride-based semiconductor laser device according to claim 1, wherein
said nitride-based semiconductor layer includes a contact layer formed on a convex portion of a cladding layer, and
said convex portion of said cladding layer and said contact layer form a ridge portion.

10. The nitride-based semiconductor laser device according to claim 1, further comprising a base for mounting an element including said nitride-based semiconductor layer, said first electrode layer and said second electrode layer from the side of said active layer.

11. A nitride-based semiconductor laser device comprising:
a nitride-based semiconductor layer formed on an active layer; and
an electrode layer formed on said nitride-based semiconductor layer, wherein
said electrode layer includes:
a first electrode layer containing a material having strong adhesive force to said nitride-based semiconductor layer, and
a second electrode layer, formed on said first electrode layer, having weaker adhesive force to said nitride-based semiconductor layer than said first electrode layer for reducing an energy barrier of said electrode layer against said nitride-based semiconductor layer.

12. A nitride-based semiconductor laser apparatus comprising:
a nitride-based semiconductor layer having an active layer and a ridge potion formed on said active layer; and
a first electrode layer, formed to come into contact with an exposed upper surface of said ridge portion, having a thickness larger than the distance between the lower surface of a cladding layer located under said active layer and the upper surface of said ridge portion.

13. The nitride-based semiconductor laser apparatus according to claim 12, wherein
said first electrode layer includes:
a first metal layer coming into contact with said ridge portion, and
a second metal layer formed on said first metal layer so that its surface is exposed, and
said second metal layer has a larger thickness than said first metal layer.

14. The nitride-based semiconductor laser apparatus according to claim 13, wherein
said second metal layer includes a p-side pad electrode consisting of Au.

15. The nitride-based semiconductor laser apparatus according to claim 13, further comprising a current blocking layer formed to cover regions excluding the upper surface of said ridge portion, wherein
said first metal layer is formed not only on said ridge portion but also on said current blocking layer.

16. The nitride-based semiconductor laser apparatus according to claim 15, further comprising a contact layer, consisting of a nitride-based semiconductor, formed on said ridge portion and said current blocking layer, wherein
said first metal layer is formed on said ridge portion and said current blocking layer through said contact layer.

17. The nitride-based semiconductor laser apparatus according to claim 13, wherein
said first metal layer includes a multilayer film consisting of different metals.

18. The nitride-based semiconductor laser apparatus according to claim 12, wherein
said first electrode layer includes:
a first metal layer coming into contact with said ridge portion, and
a second metal layer formed on said first metal layer so that its surface is exposed, and
said first metal layer has a larger thickness than said second metal layer.

19. The nitride-based semiconductor laser apparatus according to claim 18, wherein
said first metal layer includes a p-side electrode having an Au film larger in thickness than said second metal layer.

20. The nitride-based semiconductor laser apparatus according to claim 18, wherein
said first metal film includes a multilayer film consisting of different metals.

21. The nitride-based semiconductor laser apparatus according to claim 18, wherein
said first metal layer having a larger thickness than said second metal layer is formed to project only on the upper surface of said ridge portion.

22. The nitride-based semiconductor laser apparatus according to claim 12, wherein
said first electrode layer includes:
a first metal layer coming into contact with said ridge portion,
a second metal layer formed on said first metal layer, and
a third metal layer formed on said second metal layer, and
said third metal layer has a larger thickness than said first metal layer and said second metal layer.

23. The nitride-based semiconductor laser apparatus according to claim 22, wherein
said third metal layer includes a p-side thick-film electrode having an Au film larger in thickness than said first metal layer and said second metal layer.

24. The nitride-based semiconductor laser apparatus according to claim 22, wherein
each of said first metal layer, said second metal layer and said third metal layer has a multilayer structure.

25. The nitride-based semiconductor laser apparatus according to claim 12, further comprising a current blocking layer formed to cover regions excluding the upper surface of said ridge portion, wherein
said current blocking layer includes either a nitride-based semiconductor having a conductivity type different from that of said ridge portion or an insulator film.

26. The nitride-based semiconductor laser apparatus according to claim 25, wherein
said current blocking layer includes a current blocking layer consisting of an SiO2 film.

27. The nitride-based semiconductor laser apparatus according to claim 25, wherein
said current blocking layer includes a current blocking layer consisting of any material of AlGaN, InGaN and GaN having a conductivity type different from that of said ridge portion.

28. The nitride-based semiconductor laser apparatus according to claim 25, wherein
said current blocking layer consists of a nitride-based semiconductor having a conductivity type different from that of said ridge portion,
said nitride-based semiconductor laser apparatus further comprising:
a second electrode layer formed on a surface exposed by partially removing said nitride-based semiconductor layer, and
a protective film consisting of an insulator film formed on a side surface exposed by partially removing said nitride-based semiconductor layer.

29. The nitride-based semiconductor laser apparatus according to claim 28, wherein
said current blocking layer includes a current blocking layer consisting of AlGaN, and
said protective film includes a protective film consisting of $SiO_2$.

30. The nitride-based semiconductor laser apparatus according to claim 12, further comprising a base for mounting an element including said nitride-based semiconductor layer and said first electrode layer from the side of said active layer.

31. The nitride-based semiconductor laser apparatus according to claim 30, wherein
said base includes a submount.

32. A nitride-based semiconductor laser apparatus comprising:
a nitride-based semiconductor layer having an active layer and a ridge portion formed on said active layer; and
a first electrode layer, formed to come into contact with an exposed upper surface of said ridge portion, having a thickness of at least 2 $\mu$m.

33. The nitride-based semiconductor laser device according to claim 3, wherein
said first electrode layer contains at least one material selected from a group consisting of Pt, Ni, Cr, Ti, Hf and Zr, and
said second electrode layer contains Pd.

34. The nitride-based semiconductor laser device according to claim 3, wherein
said nitride-based semiconductor layer has an irregular surface.

35. The nitride-based semiconductor laser device according to claim 34, wherein
said nitride-based semiconductor layer having said irregular surface has an In composition of at least 3% and a thickness of not more than 20 nm.

36. The nitride-based semiconductor laser device according to claim 3, wherein
said nitride-based semiconductor layer includes a contact layer formed on a convex portion of a cladding layer, and
said convex portion of said cladding layer and said contact layer form a ridge portion.

37. The nitride-based semiconductor laser device according to claim 7, wherein
said first electrode layer contains at least one material selected from a group consisting of Pt, Ni, Cr, Ti, Hf and Zr, and
said second electrode layer contains Pd.

38. The nitride-based semiconductor laser device according to claim 7, wherein
said nitride-based semiconductor layer includes a contact layer formed on a convex portion of a cladding layer, and
said convex portion of said cladding layer and said contact layer form a ridge portion.

* * * * *